US 8,962,438 B2

(12) United States Patent
Park et al.

(10) Patent No.: US 8,962,438 B2
(45) Date of Patent: Feb. 24, 2015

(54) VARIABLE RESISTANCE MEMORY DEVICE AND METHOD OF FORMING THE SAME

(71) Applicant: Samsung Electronics Co., Ltd., Suwon-si, Gyeonggi-do (KR)

(72) Inventors: Jeonghee Park, Hwaseong (KR); Hideki Horii, Seoul (KR); Hyeyoung Park, Seongnam-si (KR); Jin Ho Oh, Seongnam-si (KR); Hyun-Suk Kwon, Seoul (KR)

(73) Assignee: Samsung Electronics Co., Ltd., Suwon, Gyeonggi-Do (KR)

( * ) Notice: Subject to any disclaimer, the term of this patent is extended or adjusted under 35 U.S.C. 154(b) by 0 days.

(21) Appl. No.: 14/032,997

(22) Filed: Sep. 20, 2013

(65) Prior Publication Data
US 2014/0024195 A1 Jan. 23, 2014

Related U.S. Application Data

(63) Continuation of application No. 12/973,124, filed on Dec. 20, 2010, now Pat. No. 8,552,412.

(30) Foreign Application Priority Data

Dec. 21, 2009 (KR) .................. 10-2009-0128097

(51) Int. Cl.
*H01L 45/00* (2006.01)
*H01L 27/24* (2006.01)

(52) U.S. Cl.
CPC .............. *H01L 45/16* (2013.01); *H01L 45/124* (2013.01); *H01L 45/1293* (2013.01); *H01L 45/141* (2013.01); *H01L 45/1683* (2013.01);
(Continued)

(58) Field of Classification Search
CPC . H01L 45/16; H01L 45/1683; H01L 45/1666; H01L 45/1675
USPC ........ 257/2, 4, 5, E45.001, E45.002; 438/382
See application file for complete search history.

(56) References Cited

U.S. PATENT DOCUMENTS

| 5,751,012 A | 5/1998 | Wolstenholme et al. |
| 6,586,761 B2 | 7/2003 | Lowrey |
| 6,653,195 B1 | 11/2003 | Gonzalez et al. |

(Continued)

FOREIGN PATENT DOCUMENTS

| CN | 1763986 | 4/2006 |
| CN | 101436607 | 5/2009 |

(Continued)

*Primary Examiner* — Matthew W Such
*Assistant Examiner* — Scott Stowe
(74) *Attorney, Agent, or Firm* — F. Chau & Associates, LLC

(57) ABSTRACT

Provided are a variable resistance memory device and a method of forming the same. The variable resistance memory device may include a substrate, a plurality of bottom electrodes on the substrate, and a first interlayer insulating layer including a trench formed therein. The trench exposes the bottom electrodes and extends in a first direction. The variable resistance memory device further includes a top electrode provided on the first interlayer insulating layer and extending in a second direction crossing the first direction and a plurality of variable resistance patterns provided in the trench and having sidewalls aligned with a sidewall of the top electrode.

18 Claims, 29 Drawing Sheets

(52) U.S. Cl.
CPC ............ *H01L45/06* (2013.01); *H01L 45/1233* (2013.01); *H01L 27/2463* (2013.01)
USPC ........................ 438/382; 257/4; 257/5; 257/2

(56) References Cited

U.S. PATENT DOCUMENTS

| | | | |
|---|---|---|---|
| 6,858,542 | B2 | 2/2005 | Sparks et al. |
| 7,009,694 | B2 | 3/2006 | Hart et al. |
| 7,238,959 | B2 | 7/2007 | Chen |
| 7,319,057 | B2 | 1/2008 | Lowrey |
| 7,397,060 | B2 | 7/2008 | Lung |
| 7,919,768 | B2 | 4/2011 | Chen et al. |
| 8,278,206 | B2 | 10/2012 | Oh et al. |
| 2006/0046509 | A1 | 3/2006 | Gwan-Hyeob |
| 2006/0097341 | A1 | 5/2006 | Pellizzer et al. |
| 2006/0098472 | A1 | 5/2006 | Ahn et al. |
| 2006/0197130 | A1 | 9/2006 | Suh et al. |
| 2006/0226411 | A1 | 10/2006 | Lee |
| 2006/0278863 | A1 | 12/2006 | Chang et al. |
| 2007/0096074 | A1 | 5/2007 | Asano et al. |
| 2007/0111429 | A1 | 5/2007 | Lung |
| 2007/0236989 | A1 | 10/2007 | Lung |
| 2007/0246440 | A1 | 10/2007 | Sato |
| 2007/0279962 | A1 | 12/2007 | Nirschl et al. |
| 2008/0035961 | A1 | 2/2008 | Chen et al. |
| 2008/0048293 | A1 | 2/2008 | Horii |
| 2008/0067491 | A1 | 3/2008 | Lowrey |
| 2008/0093591 | A1 | 4/2008 | Khang et al. |
| 2008/0099753 | A1 | 5/2008 | Song et al. |
| 2008/0179584 | A1 | 7/2008 | Lung |
| 2008/0185571 | A1 | 8/2008 | Happ et al. |
| 2009/0091971 | A1 | 4/2009 | Dennison et al. |
| 2009/0230378 | A1* | 9/2009 | Ryoo et al. ......................... 257/4 |
| 2009/0242866 | A1* | 10/2009 | Ko et al. ............................ 257/2 |
| 2010/0163817 | A1 | 7/2010 | Savransky et al. |

FOREIGN PATENT DOCUMENTS

| | | |
|---|---|---|
| CN | 101459129 | 6/2009 |
| JP | 2006-074028 | 3/2006 |
| JP | 2006-229237 | 8/2006 |
| JP | 2006-344951 | 12/2006 |
| JP | 2007-035683 | 2/2007 |
| JP | 2007-288083 | 11/2007 |
| JP | 2008-053495 | 3/2008 |
| JP | 2008-263159 | 10/2008 |
| KR | 1020040033017 | 4/2004 |
| KR | 1020040047272 | 6/2004 |
| KR | 1020060020514 | 3/2006 |
| KR | 1020060092551 | 8/2006 |
| KR | 1020060128380 | 12/2006 |

\* cited by examiner

# VARIABLE RESISTANCE MEMORY DEVICE AND METHOD OF FORMING THE SAME

CROSS-REFERENCE TO RELATED APPLICATIONS

This application is a continuation application of co-pending application U.S. application Ser. No. 12/973,124 filed Dec. 20, 2010, which claims priority under 35 U.S.C. §119 of Korean Patent Application No. 10-2009-0128097, filed on Dec. 21, 2009, the disclosures of which are each hereby incorporated by reference herein in their entireties.

BACKGROUND OF THE INVENTIVE CONCEPT

The present disclosure herein relates to semiconductor memory devices, and more particularly, to a variable resistance memory device and to a method of forming the same.

Generally, semiconductor memory devices are classified into volatile memory devices and nonvolatile memory devices. Volatile memory devices may lose their stored data when their power supplies are interrupted. Volatiles memory devices may, for example, include a dynamic random access memory (DRAM) and a static random access memory (SRAM). Nonvolatile memory devices may maintain their stored data even when their power supplies are interrupted. Nonvolatile memory devices may, for example, include a programmable read only memory (PROM), an erasable PROM (EPROM), an electrically EPROM (EEPROM), a flash memory device.

Also, according to a trend of high performance and low power in the recent semiconductor memory devices, next generation semiconductor memory devices have been developed. The next generation semiconductor memory devices may, for example, include a ferroelectric random access memory (FRAM), a magnetic random access memory (MRAM) and a phase change random access memory (PRAM). Material constituting the next generation semiconductor memory devices may have a different resistance depending on a current forced thereto or a voltage applied thereto, and have a characteristic maintaining a resistance even when a current supply or a voltage supply is interrupted.

SUMMARY OF THE INVENTIVE CONCEPT

Embodiments of the inventive concept provide a variable resistance memory device. The variable resistance memory device may include a substrate, a plurality of bottom electrodes on the substrate; a first interlayer insulating layer including a trench formed therein. The trench exposes the bottom electrodes and extends in a first direction. The variable resistance memory device further includes a top electrode provided on the first interlayer insulating layer and extending in a second direction crossing the first direction and a plurality of variable resistance patterns provided in the trench and having sidewalls aligned with a sidewall of the top electrode.

Embodiments of the inventive concept provide a variable resistance memory device. The variable resistance memory device may include a plurality of bottom electrodes on the substrate, a plurality of variable resistance lines provided on the bottom electrodes and extending in a first direction. The variable resistance lines are provided inside a trench exposing the bottom electrodes extending in the first direction. The variable resistance memory device further includes a top electrode provided on the variable resistance lines and extending in a second direction crossing the first direction and a diffusion preventing pattern between the variable resistance patterns and the top electrode.

Embodiments of the inventive concept also provide a method of manufacturing a variable resistance memory device. The method may include forming a plurality of bottom electrodes on a substrate, and forming a plurality of variable resistance lines extending in a first direction on the bottom electrodes. The forming of the variable resistance lines includes forming a first interlayer insulating layer on the bottom electrodes, forming a trench in the first interlayer insulating layer, the trench extending in the first direction and exposing a portion of a top surface of the bottom electrode and forming a variable resistance material layer in the trench. The method further includes forming a top electrode extending in a second direction crossing the first direction on the variable resistance lines.

BRIEF DESCRIPTION OF THE DRAWINGS

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the figures:

FIGS. 4A through 8A are cross-sectional views taken along the line A-A' of FIG. 2 illustrating a method of manufacturing a variable resistance memory device in accordance with the first embodiment of the present inventive concept.

FIGS. 4B through 8B are cross-sectional views taken along the line B-B' of FIG. 2 illustrating a method of manufacturing a variable resistance memory device in accordance with the first embodiment of the present inventive concept.

FIGS. 11A through 13A are cross-sectional views taken along the line C-C' of FIG. 9 illustrating a method of manufacturing a variable resistance memory device in accordance with the second embodiment of the present inventive concept.

FIGS. 11B through 13B are cross-sectional views taken along the line D-D' of FIG. 9 illustrating a method of manufacturing a variable resistance memory device in accordance with the second embodiment of the present inventive concept.

FIGS. 16A through 19A are cross-sectional views taken along the line E-E' of FIG. 14 illustrating a method of manufacturing a variable resistance memory device in accordance with the third embodiment of the present inventive concept.

FIGS. 16B through 19B are cross-sectional views taken along the line F-F' of FIG. 14 illustrating a method of manufacturing a variable resistance memory device in accordance with the third embodiment of the present inventive concept.

FIGS. 22A through 24A are cross-sectional views taken along the line G-G' of FIG. 20 illustrating a method of manufacturing a variable resistance memory device in accordance with the fourth embodiment of the present inventive concept.

FIGS. 22B through 24B are cross-sectional views taken along the line H-H' of FIG. 20 illustrating a method of manufacturing a variable resistance memory device in accordance with the fourth embodiment of the present inventive concept.

DETAILED DESCRIPTION OF THE EXEMPLARY EMBODIMENTS

Figure 1:
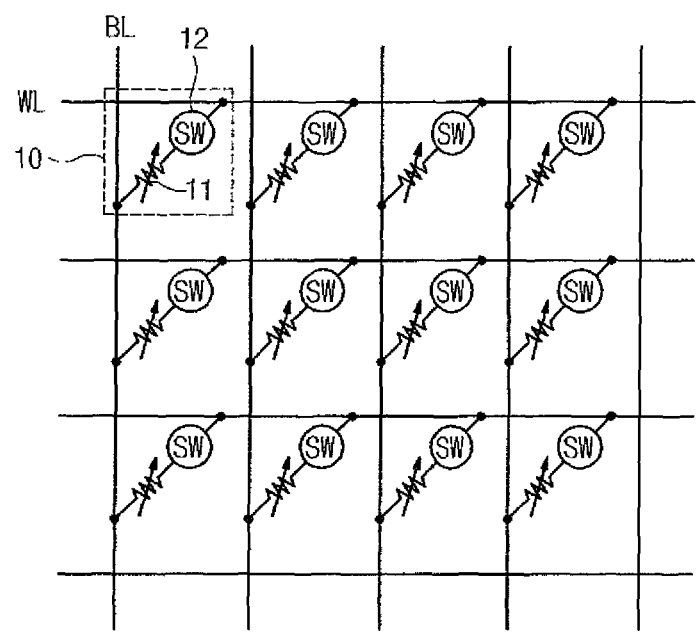
FIG. 1 is a circuit diagram illustrating a memory cell array of a variable resistance memory device in accordance with embodiments of the present inventive concept.

Preferred embodiments of the inventive concept will be described below in more detail with reference to the accompanying drawings. The embodiments of the inventive concept may, however, be embodied in different forms and should not be constructed as limited to the embodiments set forth herein. Rather, these embodiments are provided so that this disclosure will be thorough and complete, and will fully convey the scope of the inventive concept to those skilled in the art. Like numbers refer to like elements throughout.

In the drawings, the thickness of layers and regions are exaggerated for clarity. It will also be understood that when an element such as a layer, region or substrate is referred to as being "on" or "onto" another element, it may lie directly on the other element or intervening elements or layers may also be present.

It will be understood that, although the terms first, second, etc. may be used herein to describe various elements, these elements should not be limited by these terms. These terms are only used to distinguish one element from another. For example, a first region/layer could be termed a second region/layer, and, similarly, a second region/layer could be termed a first region/layer without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof Embodiments of the inventive concept may be described with reference to cross-sectional illustrations, which are schematic illustrations of idealized embodiments of the present invention. As such, variations from the shapes of the illustrations, as a result, for example, of manufacturing techniques and/or tolerances, are to be expected. Thus, embodiments of the present invention should not be construed as limited to the particular shapes of regions illustrated herein, but are to include deviations in shapes that result from, e.g., manufacturing. For example, a region illustrated as a rectangle may have rounded or curved features. Thus, the regions illustrated in the figures are schematic in nature and are not intended to limit the scope of the present invention.

FIG. 1 is a circuit diagram illustrating a memory cell array of a variable resistance memory device in accordance with embodiments of the present inventive concept.

Referring to FIG. 1, a plurality of memory cells 10 may be arranged in a matrix form. The memory cells 10 may include a variable resistance device 11 and a select device 12. The variable resistance device 11 and the select device 12 may be interposed between a bit line (BL) and a word line (WL).

A state of the variable resistance device 11 may be determined by the amount of current supplied through the bit line (BL). The select device 12 may be connected between the variable resistance device 11 and the word line (WL) and control a current supplied to the variable resistance device 11 according to the voltage of the word line (WL). The select device 12 may be, for example, a diode, a MOS transistor or a bipolar transistor.

In embodiments of the present inventive concept, a phase change memory device is described by example. The phase change memory device includes memory cells adopting a phase change material as the variable resistance device 11. However, a technical sprit of the present inventive concept is not limited thereto. The phase change material has an amorphous state having a relatively high resistance and a crystal state having a relatively low resistance depending on a temperature and a cooling time. The amorphous state may be a set state and the crystal state may be a reset state. Joule's heat is generated in the phase change memory device according to the amount of current supplied through a bottom electrode thereof to heat a phase change material. At this time, Joule's heat is generated in proportion to resistivity of a phase change material and a current supplying time.

Figure 2:
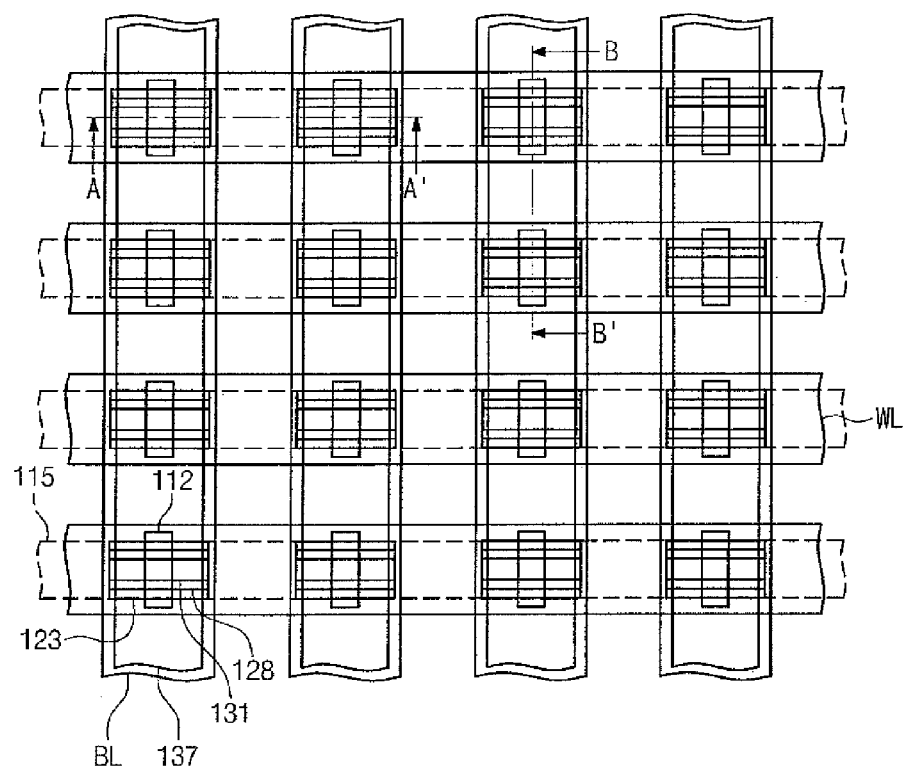
FIG. 2 is a top plan view of a variable resistance memory device in accordance with a first embodiment of the present inventive concept.
Figure 3A:
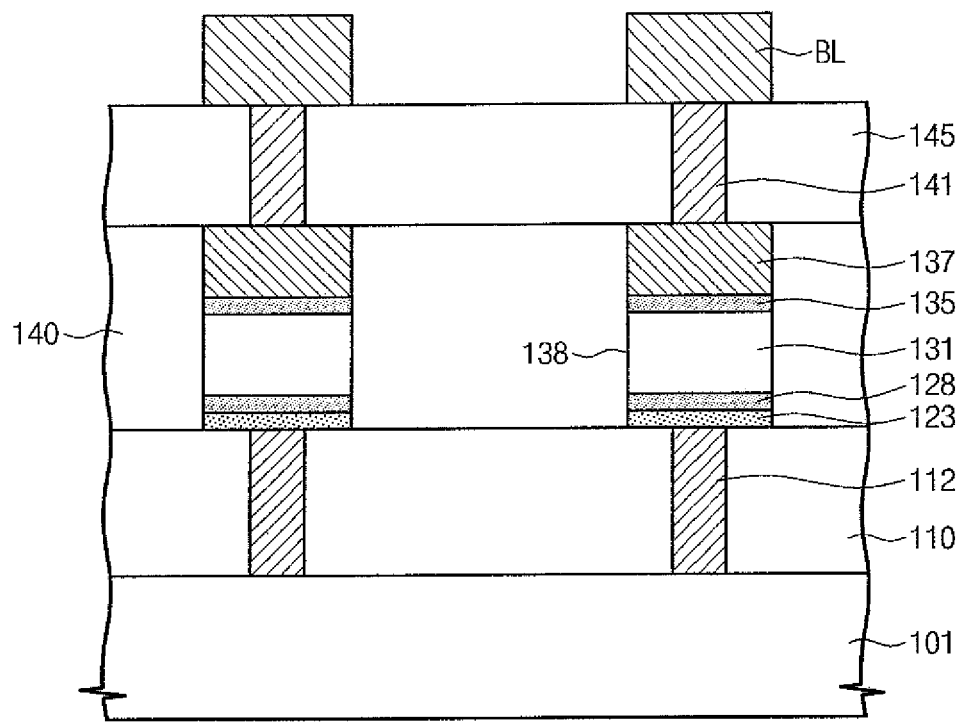
FIGS. 3A and 3B are cross-sectional views of a variable resistance memory device in accordance with the first embodiment of the present inventive concept, the cross-sectional views being taken along the lines A-A' and B-B' illustrated in FIG. 2, respectively.
Figure 3B:
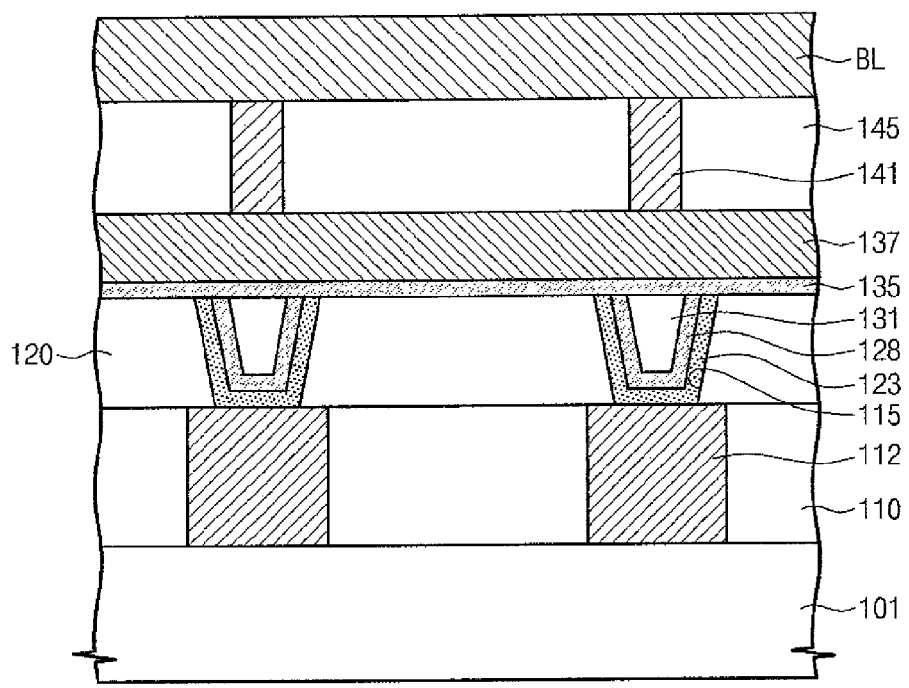

FIG. 2 is a top plan view of a variable resistance memory device in accordance with a first embodiment of the present inventive concept. FIGS. 3A and 3B are cross-sectional views of a variable resistance memory device in accordance with the first embodiment of the present inventive concept. FIGS. 3A and 3B are cross-sectional views taken along the lines A-A' and B-B' illustrated in FIG. 2, respectively.

Referring to FIGS. 2, 3A and 3B, a first interlayer insulating layer 110 including bottom electrodes 112 may be provided on a substrate 101. The substrate 101 may include word lines (WL) extending in a first direction. The word lines (WL) may be a doping line doped with an impurity. The semiconductor substrate 101 may include a select device (not illustrated) connected to the word lines (WL). The bottom electrodes 112 may have top surfaces of, for example, a line shape, an arc shape, a round shape, a square shape or a ring shape. In the present embodiment, the bottom electrodes 112 have top surfaces of a line shape arranged in a single line in a second direction crossing the first direction. That is, the top surfaces of the bottom electrodes 112 may have a major axis in the second direction and a minor axis in the first direction.

Variable resistance patterns 123, for example, phase change material patterns may be provided on the bottom electrodes 112. The variable resistance patterns 123 may be material of which a state is reversibly changed. For example, the variable resistance patterns 123 may be formed of compound which is a combination of at least one of tellurium (Te) and selenium (Se) which is an element of a chalcogenide system and at least one selected from germanium (Ge), antimony (Sb), bismuth (Bi), lead (Pb), tin (Sn), silver (Ag), arsenic (As), sulfur (S), silicon (Si), phosphorus (P), oxygen (O) and carbon (C). In the present embodiment, the variable resistance patterns 123 may have, for example, a U shape. The variable resistance patterns 123 may be provided in a trench 115 extending in the first direction. The trench 115 may be formed in a second interlayer insulating layer 120. Thus, the variable resistance patterns 123 may be separately provided in the second direction on the bottom electrodes 112. The variable resistance patterns 123 may be separated in the first direction. That is, the variable resistance patterns 123, as illustrated in FIG. 3A, may be separately provided in the first direction on the bottom electrodes 112. That is, the variable resistance patterns 123 may be provided to be an isolated type structure on the bottom electrodes 112. The isolated type structure of the variable resistance patterns 123 may alleviate an interference phenomenon between cells.

A heat loss preventing pattern 128 may be provided on the variable resistance patterns 123. The heat loss preventing pattern 128 may prevent heat generated when heating a phase change material from being lost. Thus, a phase change material can be heated to a melting point by a small amount of current. That is, the power consumption of the variable resistance memory device may be reduced. The heat loss preventing pattern 128 may be formed of an insulating layer including, for example, one selected from a group consisting of silicon oxynitride (SiON), carbon (C), atomic layer deposition (ALD)-aluminum nitride (AlN), germanium nitride (GeN), aluminum oxide ($Al_2O_3$), magnesium oxide (MgO), silicon dioxide ($SiO_2$), calcium oxide (CaO), yttrium oxide ($Y_2O_3$), titanium dioxide ($TiO_2$), chromium oxide ($Cr_2O_3$), iron oxide (FeO), cobalt oxide (CoO), zirconium oxide (ZrO) and copper oxide ($CuO_2$). The heat loss preventing pattern 128 may be formed to have the same shape as the variable resistance patterns 123 thereon. An insulating pattern 131 filling the trench 115 may be provided on the heat loss preventing pattern 128. The insulating pattern 131 may be, for example, an oxide layer.

A top electrode 137 extending in the second direction may be provided on the variable resistance patterns 123. The top electrode 137 may cross the trench 115. A diffusion preventing pattern 135 may be provided between the variable resistance patterns 123 and the top electrode 137. The diffusion preventing pattern 135 may extend in the second direction.

The variable resistance patterns 123, the heat loss preventing pattern 128, the insulating pattern 131, the diffusion preventing pattern 135 and the top electrode 137 may have aligned side walls 138 as illustrated in FIG. 3A. That is, the variable resistance patterns 123, the heat loss preventing pattern 128 and the insulating pattern 131 may include sidewalls aligned with sidewalls of the top electrode 137. A third interlayer insulating layer 140 may be provided between the aligned sidewalls 138.

A bit line (BL) crossing the word line (WL) may be provided on the top electrode 137. The bit line (BL) may be electrically connected to the top electrode 137 through a contact plug 141 formed in a fourth interlayer insulating layer 145.

In the present embodiment, a sidewall of the variable resistance pattern 123 aligned with the top electrode 137 is a long distance away from the bottom electrode 112. Therefore, deterioration of an electric characteristic due to damage occurring when the variable resistance patterns 123 are formed by patterning may be improved.

Hereinafter, a method of manufacturing a variable resistance memory device in accordance with a first embodiment of the present inventive concept will be described.

FIGS. 4A through 8A are cross-sectional views taken along the line A-A' of FIG. 2 illustrating a method of manufacturing a variable resistance memory device in accordance with the first embodiment of the present inventive concept. FIGS. 4B through 8B are cross-sectional views taken along the line B-B' of FIG. 2 illustrating a method of manufacturing a variable resistance memory device in accordance with the first embodiment of the present inventive concept.

Figure 4A:
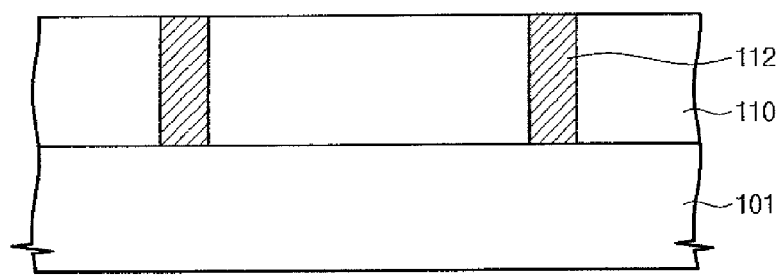
Figure 4B:
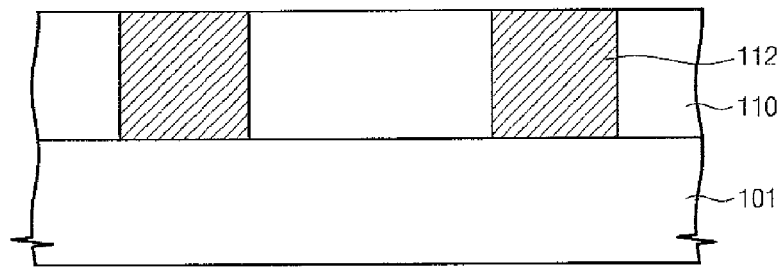

Referring to FIGS. 2, 4A and 4B, a substrate 101 including a word line (WL) and a select device (not illustrated) is provided. The word line (WL) in the substrate 101 may be an impurity region doped with an impurity formed in a line shape and a device isolation layer (not illustrated) may be formed between the word lines (WL). A select device (not illustrated) such as, for example, a diode or a transistor may be provided on the word line (WL).

A first interlayer insulating layer 110 is formed on the substrate 101. For example, the first interlayer insulating layer 110 may be formed of a silicon oxide layer such as BSG (borosilicate glass), PSG (phosphosilicate glass), BPSG (borophosphosilicate glass), PE-TEOS (plasma enhanced tetra ethyl ortho silicate) or HDP (high density plasma). Other interlayer insulating layers which will be described below may be formed of the same material as that of the first interlayer insulating layer. Bottom electrodes 112 are formed in the first interlayer insulating layer 110. The bottom electrode 112 may be formed on the word line (WL) so that a length of the bottom electrode 112 in the first direction is greater than that in the first direction. The bottom electrodes 112 may be formed by depositing a conductive layer after patterning the first interlayer insulating layer 110. After depositing the conductive layer, a planarization process may be performed. The bottom electrodes 112 may be formed of, for example, material selected from a group consisting of titanium (Ti), titanium silicide ($TiSi_x$), titanium nitride (TiN), titanium oxynitride (TiON), titanium tungsten (TiW), titanium aluminum nitride (TiAlN), titanium aluminum oxynitride (TiAlON), titanium silicon nitride (TiSiN), titanium boron nitride (TiBN), tungsten (W), tungsten silicide (WSix), tungsten indium (WIN), tungsten oxynitride (WON), tungsten silicon nitride (WSiN), tungsten boron nitride (WBN), tungsten cyanide (WCN), tantalum (Ta), tantalum silicide ($TaSi_x$), tantalum nitride (TaN), tantalum oxynitride (TaON), tantalum aluminum nitride (TaAlN), tantalum silicon nitride (TaSiN), tantalum cyanide (TaCN), molybdenum (Mo), molybdenum nitride (MoN), molybedenum silicon nitride (MoSiN), molybdenum aluminum nitride (MoAlN), niobium nitride (NbN), zirconium silicon nitride (ZrSiN), zirconium aluminum nitride (ZrAlN), ruthenium (Ru), cobalt suicide ($CoSi_x$), nickel silicide ($NiSi_x$), conductive carbon, copper (Cu) and a combination layer thereof.

Figure 5A:
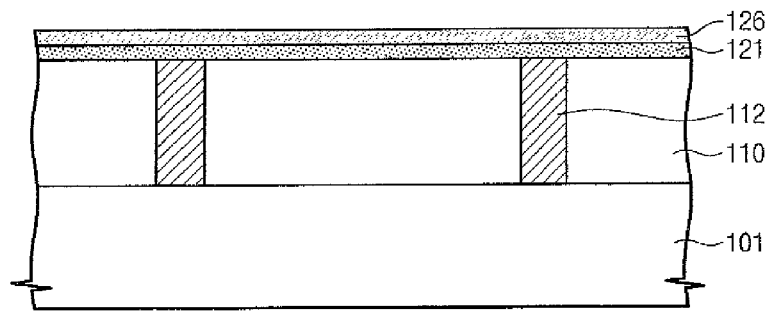
Figure 5B:
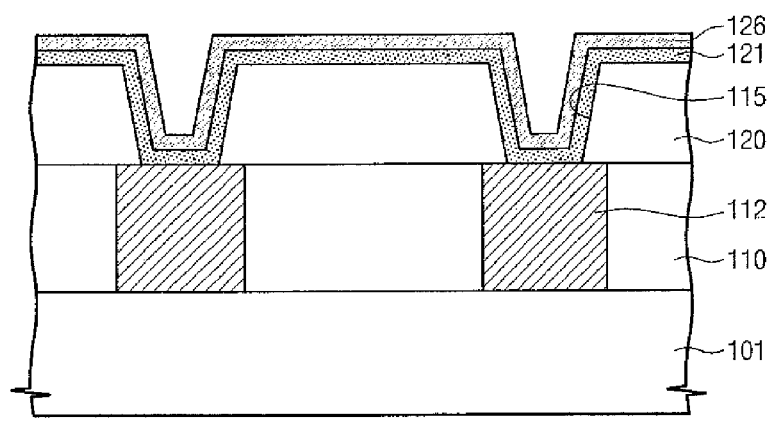

Referring to FIGS. 2, 5A and 5B, a second interlayer insulating layer 120 is provided on the bottom electrodes 112. The second interlayer insulating layer 120 is patterned to form a trench 115 extending in the first direction. The trench 115 exposes a portion of top surface of the bottom electrode 112. The trench 115 may be formed by, for example, anisotropically etching the second interlayer insulating layer 120 so that a width of the trench is reduced from an upper portion to a lower portion.

A variable resistance material layer 121 may be formed on a sidewall and a bottom surface of the trench 115 and on the second interlayer insulating layer 120. The variable resistance material layer 121 may be electrically connected to the bottom electrodes 112. The variable resistance material layer 121 may be formed of, for example, a compound which is a combination of at least one of Te and Se which is an element of a chalcogenide system and at least one selected from Ge, Sb, Bi, Pb, Sn, Ag, As, S, Si, P, O and C. The variable resistance material layer 121 may be formed by, for example, a physical vapor deposition (PVD) method or a chemical vapor deposition (CVD) method. The variable resistance material layer 121 may be conformally deposited inside the trench 115. Before the variable resistance material layer 121 is formed, a seed layer (not illustrated) may be additionally formed. The seed layer may be, for example, a metal oxide layer such as a titanium oxide layer, a zirconium oxide layer and a magnesium oxide layer.

A heat loss preventing layer 126 may be formed on the variable resistance material layer 121. The heat loss preventing layer 126 may be conformally formed to extend along a surface of the variable resistance material layer 121. The heat loss preventing layer 126 may prevent heat generated when a phase change material is heated from being lost. The heat loss preventing layer 126 may also protect the variable resistance material layer 121 from subsequent processes. The heat loss preventing layer 126 may be formed of an insulating layer including one selected from a group consisting of, for example, SiON, C, ALD—AlN, GeN, $Al_2O_3$, MgO, $SiO_2$, CaO, $Y_2O_3$, $TiO_2$, $Cr_2O_3$, FeO, CoO, ZrO and $CuO_2$. The heat loss preventing layer 126 may be formed by, for example, a plasma enhanced CVD (PE-CVD).

Figure 6A:
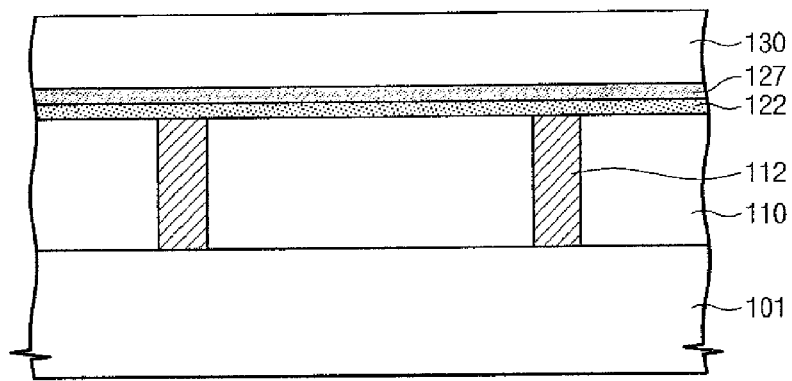
Figure 6B:
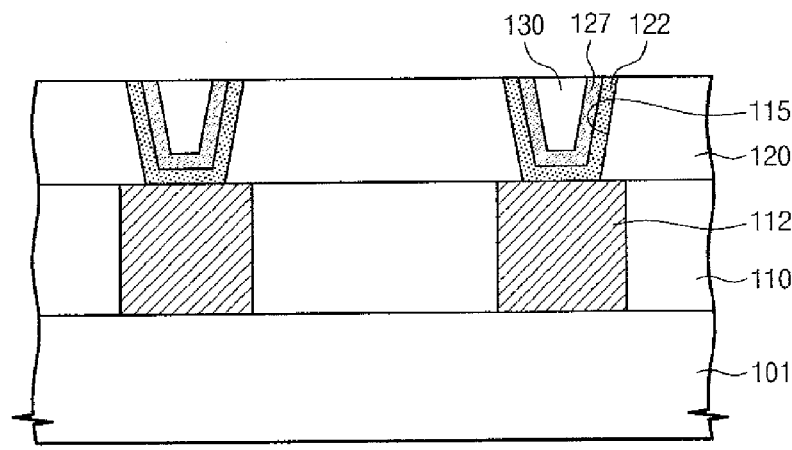

Referring to FIGS. 2, 6A and 6B, an insulating layer 130 may be formed so as to completely fill the trench 115 on the heat loss preventing layer 126. The insulating layer 130 may include a silicon oxide layer having a good gap-fill characteristic, for example, HDP (high density plasma) oxide, PE-TEOS (plasma-enhanced tetraethylorthosilicate), BPSG (borophosphosilicate glass), USG (undoped silicate glass), FOX (flowable oxide), HSQ (hydrosilsequioxane) or SOG (spin on glass).

After filling the trench 115 with the insulating layer 130, a planarization process is performed to divide the variable resistance material layer 121 into variable resistance lines 122. The variable resistance lines 122 may extend in the first direction in the trench 115. The heat loss preventing layer 126 may become a heat loss preventing preliminary pattern 127 by the planarization process. The planarization process may be, for example, a chemical mechanical polishing (CMP) process or an etch-back process. At this time, the heat loss preventing layer 126 may function as an etch stop layer. After the planarization process, a plasma process using, for example, an inert gas may be performed. The plasma process can remove surface damages or surface pollutants of the variable resistance patterns caused by the planarization process. That is, RF power is applied to an inert gas to generate plasma and the plasma reacts to surfaces of the variable resistance patterns. As a result, surfaces of the variable resistance patterns damaged during the planarization process may be removed. Here, for example, argon (Ar), helium (He), neon (Ne), krypton (Kr) or xenon (Xe) may be used as an inert gas.

Figure 7A:
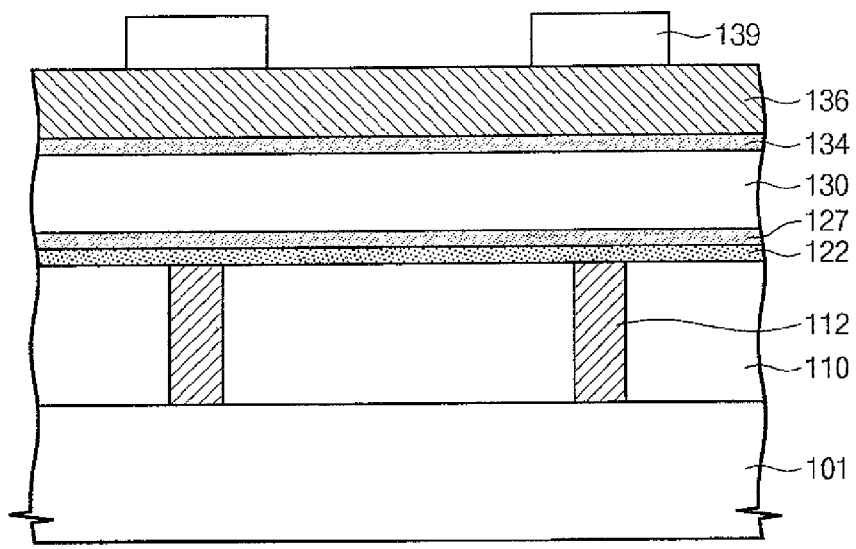
Figure 7B:
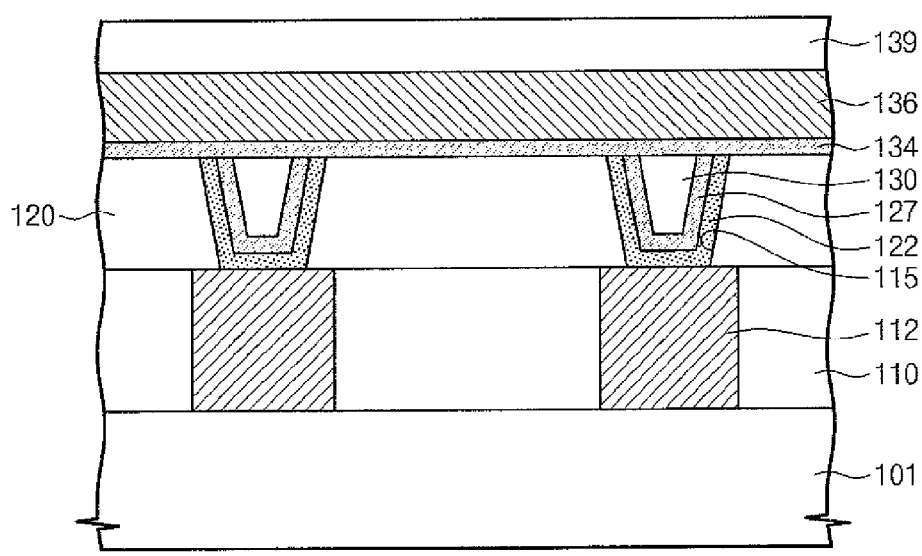

Referring to FIGS. 2, 7A and 7B, a conductive layer 136 may be formed on the variable resistance lines 122, the heat loss preventing preliminary pattern 127 and the insulating layer 130. The conductive layer 136 may be the same material as the bottom electrodes 112. A diffusion preventing layer 134 may be provided between the conductive layer 136 and the variable resistance lines 122. The conductive layer 136 and the diffusion preventing layer 134 may be formed by, for example, a PVD process or a CVD process. The diffusion preventing layer 134 may include at least one of, for example, titanium (Ti), tantalum (Ta), molybdenum (Mo), hafnium (Hf), zirconium (Zr), chromium (Cr), tungsten (W), niobium (Nb), vanadium (V), nitrogen (N), carbon (C), aluminum (Al), boron (B), phosphorus (P), oxygen (O) and sulfur (S). For example, the diffusion preventing layer 134 may include at least one of titanium nitride (TiN), titanium tungsten (TiW), titanium cyanide (TiCN), titanium aluminum nitride (TiAlN), titanium silicon carbide (TiSiC), tantalum nitride (TaN), tantalum silicon nitride (TaSiN), tungsten nitride (WN), molybdenum nitride (MoN) and cyanide (CN). A mask pattern 139 may be provided on the conductive layer 136. The mask pattern 139 may extend in the second direction.

Figure 8A:
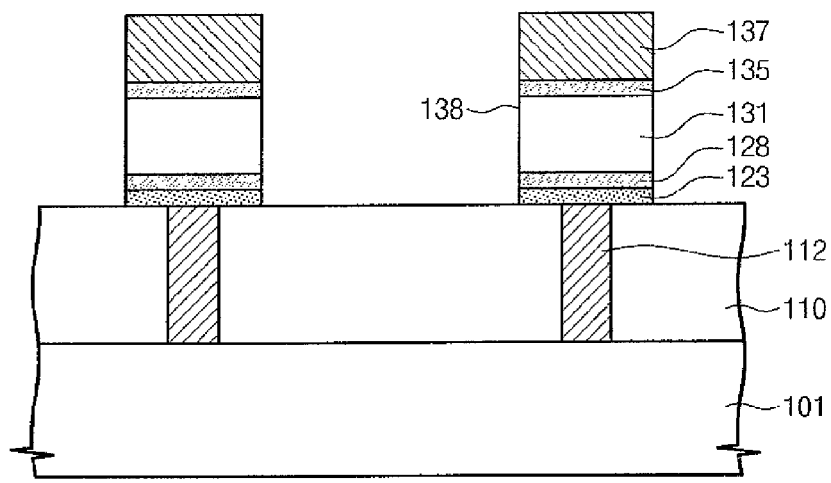
Figure 8B:
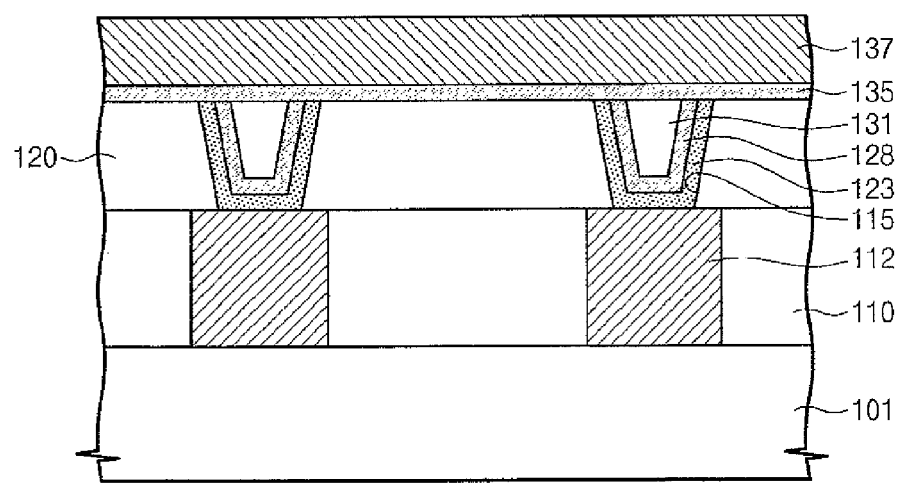

Referring to FIGS. 2, 8A and 8B, the conductive layer 136, the diffusion preventing layer 134, the insulating layer 130, the heat loss preventing preliminary pattern 127 and the variable resistance lines 122 may be patterned using the mask pattern 139 as a mask. The patterning process may be, for example, a dry etching. After the patterning process, the mask pattern 139 may be removed. A top electrode 137, a diffusion preventing pattern 135, an insulating pattern 131, a heat loss preventing pattern 128 and a variable resistance pattern 123 may be formed by the patterning process. That is, the top electrode 137 and the variable resistance pattern 123 may be simultaneously formed by the patterning process. Thus, the variable resistance pattern 123 may have a sidewall aligned with a sidewall of the top electrode 137. The variable resistance patterns 123 may be provided as an isolated type structure that the variable resistance patterns 123 are divided into each cell by the patterning process.

Referring back to FIGS. 2, 3A and 3B, a third interlayer insulating layer 140 may be formed in a recess region formed by the patterning process. The third interlayer insulating layer 140 may be formed by depositing an insulating material on the substrate 101, and then planarizing the insulating material down to a top surface of the top electrode 137.

A contact hole for a bit line exposing the top electrode 137 may be formed by forming a fourth interlayer insulating layer 145 on the top electrode 137, and then patterning the fourth interlayer insulating layer 145. A contact plug 141 may be formed by filling the contact hole for a bit line with a conductive material. A bit line (BL) contacting the contact plug 141 may be formed on the contact plug 141. The bit line (BL) may have a length parallel to the top electrode 137 and extending in the second direction.

As a memory device becomes highly integrated, an alignment between an electrode and a variable resistance pattern may become more difficult. That is, a process margin for an alignment may be gradually reduced in a structure in which a variable resistance pattern and a top electrode extend in the same direction. According to the present embodiment, since the variable resistance lines 122 are patterned together with the conductive layer 136, a misalignment difficulty between the variable resistance patterns 123 and the top electrode 137 can be prevented.

Also, the variable resistance patterns 123 may be provided as an isolated type structure in which the variable resistance patterns 123 are divided into each cell by the patterning process. The isolated type structure can alleviate an interference phenomenon between the cells.

According to the present embodiment, after the variable resistance lines 122 are formed inside the trench 115 extending in the first direction, variable resistance patterns may be formed by patterning the variable resistance lines 122 in the first direction together with the top electrode 137. The variable resistance patterns have an isolated type structure in which the variable resistance patterns are divided into each cell. After forming via hole in an interlayer insulating layer, the isolated type structure may be formed by filing the via hole with a variable resistance material. However, as the size of a memory cell is reduced, the filling process may become more difficult. According to the present embodiment, variable resistance patterns having the isolated type structure may be more readily formed.

Hereinafter, a variable resistance memory device in accordance with a second embodiment of the present inventive concept and a method of manufacturing the same will be described.

The second embodiment is similar to the first embodiment except for a difference in the type of the bottom electrode and the type of the variable resistance pattern. Thus, for convenience of description, the description of common features already discussed in the first embodiment will be omitted below.

Figure 9:
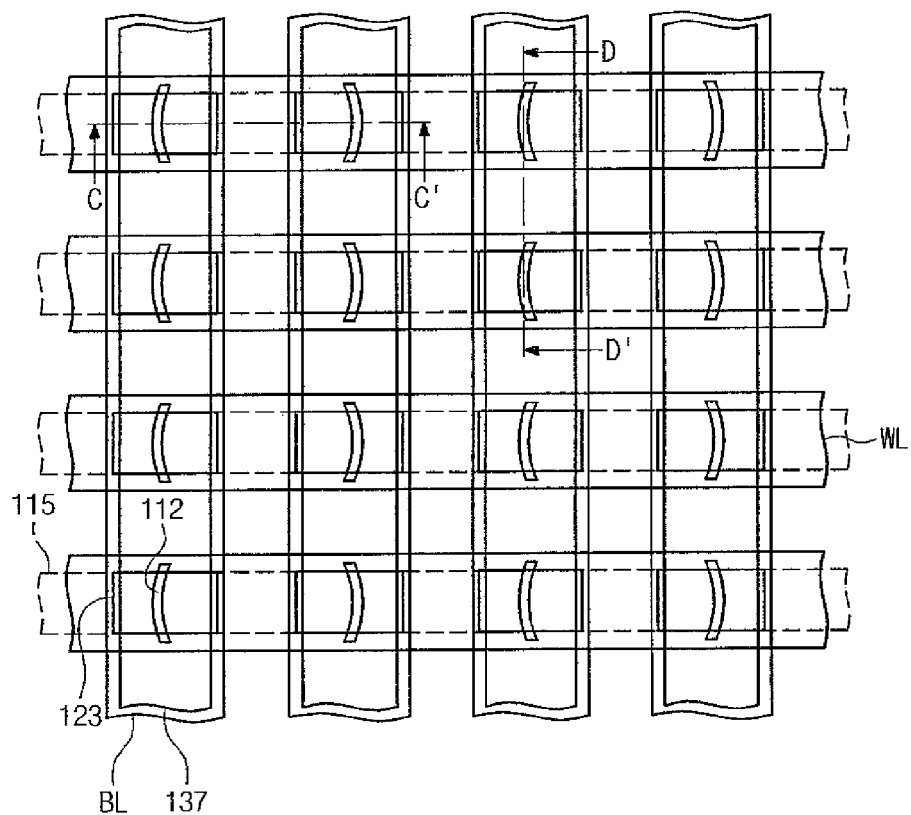
FIG. 9 is a top plan view of a variable resistance memory device in accordance with a second embodiment of the present inventive concept.
Figure 10A:
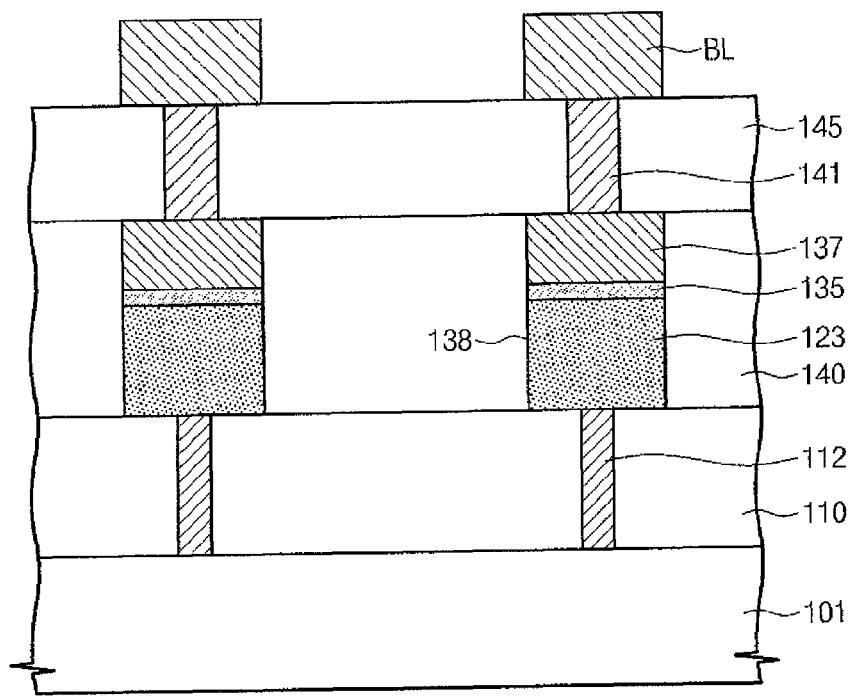
FIGS. 10A and 10B are cross-sectional views of a variable resistance memory device in accordance with the second embodiment of the present inventive concept, the cross-sectional views being taken along the lines C-C' and D-D' illustrated in FIG. 9, respectively.
Figure 10B:
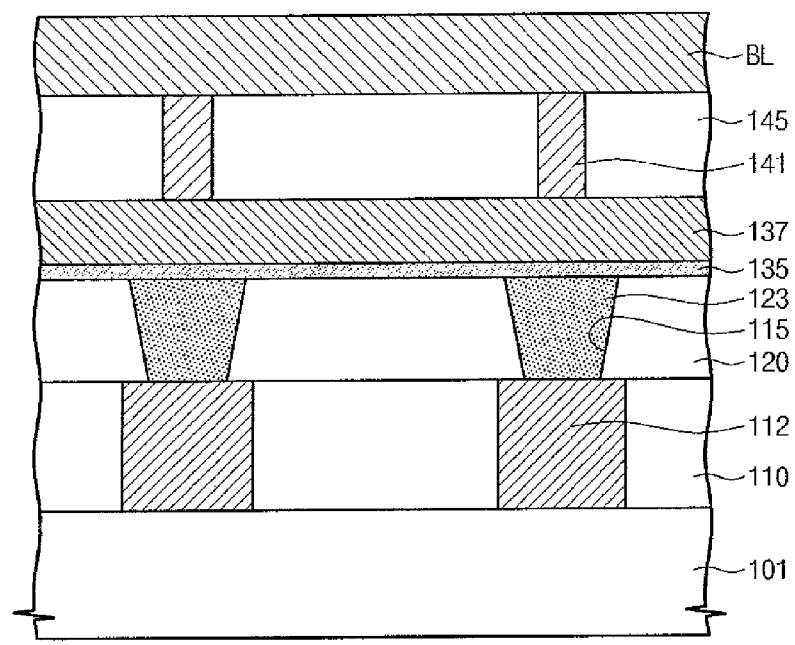

FIG. 9 is a top plan view of a variable resistance memory device in accordance with a second embodiment of the present inventive concept. FIGS. 10A and 10B are cross-sectional views of a variable resistance memory device in accordance with the second embodiment of the present inventive concept. FIGS. 10A and 10B are cross-sectional views taken along the lines C-C' and D-D' illustrated in FIG. 9, respectively.

Referring to FIGS. 9, 10A and 10B, a first interlayer insulating layer 110 including bottom electrodes 112 may be provided on a substrate 101. The substrate 101 may include a word line (WL) extending in a first direction. The word line (WL) may be a doping line doped with an impurity. The semiconductor substrate 101 may include a select device (not illustrated) connected to the word lines (WL). The bottom electrodes 121 may have top surfaces of, for example, a line shape, an arc shape, a round shape, a square shape or a ring shape. In the present embodiment, the bottom electrodes 112 have top surfaces of an arc shape. The arc shape bottom electrode 112 may have the top surface of which a length in the second direction is longer than a length in the first direction.

Variable resistance patterns, for example, a phase change material pattern, may be provided. In the present embodiment, the variable resistance patterns 123 may have a longitudinal section of a square shape. The variable resistance patterns 123 may be provided in the trench 115 extending in the first direction. The trench 115 may be formed on a second interlayer insulating layer 120. Thus, the variable resistance patterns 123 may be provided to be separated in the second direction on the bottom electrodes. The variable resistance patterns 123 may be separated in the first direction. That is, the variable resistance patterns 123, as illustrated in FIG. 10A, may be provided to be separated in the first direction on the bottom electrodes 112. That is, the variable resistance patterns 123 may be provided in an isolated type structure on each of the bottom electrodes 112. The isolated type structure of the variable resistance patterns 123 can alleviate an interference phenomenon between the cells.

A top electrode 137 extending in the second direction may be provided on the variable resistance patterns 123. The top electrode 137 may cross the trench 115. A diffusion preventing pattern 135 may be provided between the variable resistance patterns 123 and the top electrode 137. The diffusion preventing pattern 135 may extend in the second direction.

The variable resistance patterns 123, the diffusion preventing pattern 135 and the top electrode 137 may have aligned sidewalls 138 as illustrated in FIG. 10A. That is, the variable resistance patterns 123 may include sidewalls aligned with a sidewall of the top electrode 137. A third interlayer insulating layer 140 may be provided between the aligned sidewalls 138.

A bit line (BL) crossing the word line (WL) may be provided on the top electrode 137. The bit line (BL) may be electrically connected to the top electrode 137 through a contact plug 141 formed in a fourth interlayer insulating layer 145.

In the present embodiment, a side wall of the variable resistance pattern 123 aligned with the top electrode 137 is a long distance away from the bottom electrode 112. Therefore, deterioration of an electric characteristic due to damage occurring when the variable resistance patterns 123 are formed by patterning may be improved.

Hereinafter, a method of manufacturing a variable resistance memory device in accordance with a second embodiment of the present inventive concept is provided.

FIGS. 11A through 13A are cross-sectional views taken along the line C-C' of FIG. 9 illustrating a method of manufacturing a variable resistance memory device in accordance with the second embodiment of the present inventive concept. FIGS. 11B through 13B are cross-sectional views taken along the line D-D' of FIG. 9 illustrating a method of manufacturing a variable resistance memory device in accordance with the second embodiment of the present inventive concept.

Figure 11A:
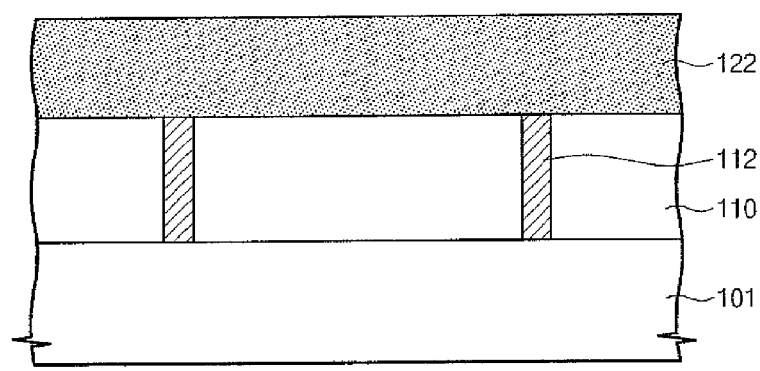
Figure 11B:
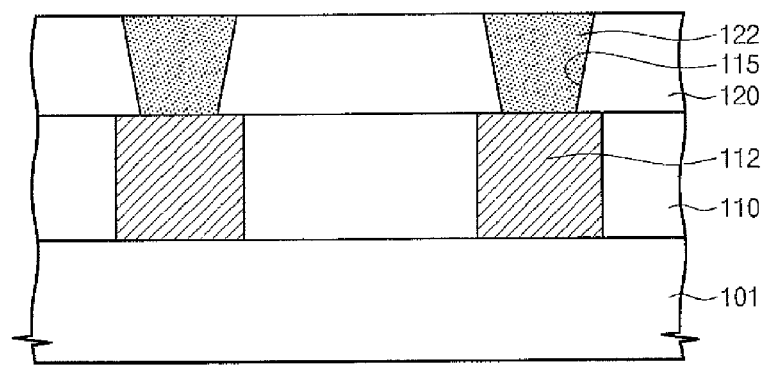

Referring to FIGS. 9, 11A and 11B, a first interlayer insulating layer 110 is formed on a substrate 101. Bottom electrodes 112 are formed in the first interlayer insulating layer 110. In the embodiment, the bottom electrodes 112 are formed to have top surfaces of an arc shape. The bottom electrodes 112 having top surfaces of an arc shape may be symmetrical to an adjacent memory cell. For example, the bottom electrodes 112 having top surfaces of an arc shape may be formed by forming an opening over adjacent two memory cell regions, conformally depositing a conductive layer for a bottom electrode along an inner wall of the opening and then patterning the conductive layer for a bottom electrode to remove the conductive layer for a bottom electrode by the adjacent two memory cell regions. The bottom electrodes 112 may be formed to have, for example, a "U" shape instead of a top surface of an arc shape.

A second interlayer insulating layer 120 is provided on the bottom electrodes 112. The second interlayer insulating layer 120 is patterned to form a trench 115 extending in a first direction. The trench 115 exposes a portion of top surface of the bottom electrode 112. The trench 115 may be formed by, for example, anisotropically etching the second interlayer insulating layer 120 so that a width of the trench 115 is reduced from an upper portion to a lower portion.

Variable resistance lines 122 may be formed in the trench 115. The variable resistance lines 122 may extend in the first direction. The variable resistance lines 122 are disposed to be separated in the second direction. The variable resistance lines 122 may be formed by depositing a variable resistance material layer on the second interlayer insulating layer 120 to fill the trench 115 and then planarize the variable resistance material layer.

Figure 12A:
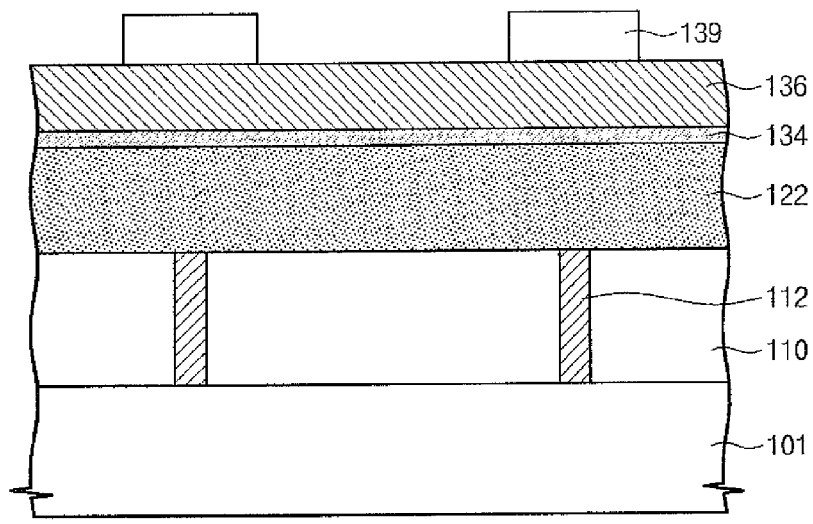
Figure 12B:
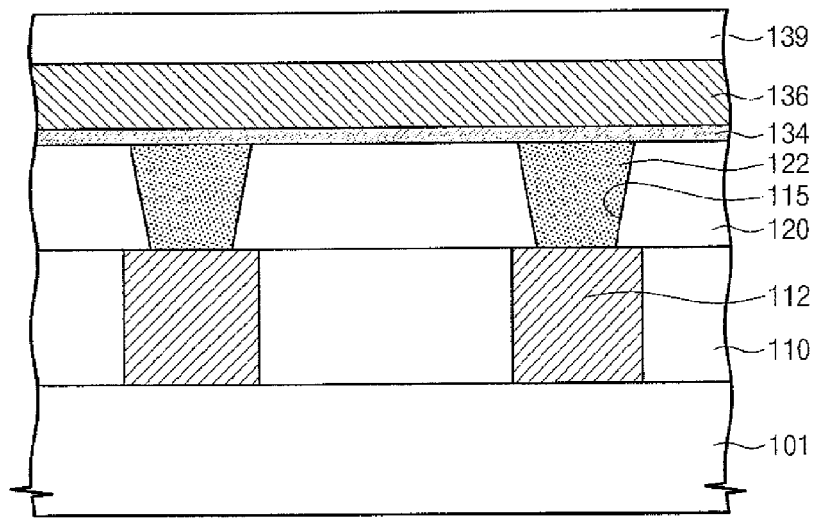

Referring to FIGS. 9, 12A and 12B, a conductive layer 136 may be formed on the variable resistance lines 122. The conductive layer 136 may be the same material as the bottom electrodes 112. A diffusion preventing layer 134 may be provided between the conductive layer 136 and the variable resistance lines 122. The conductive layer 136 and the diffusion preventing layer 134 may be formed by, for example, a PVD process or a CVD process. A mask pattern 139 may be provided on the conductive layer 136. The mask pattern 139 may extend in the second direction.

Figure 13A:
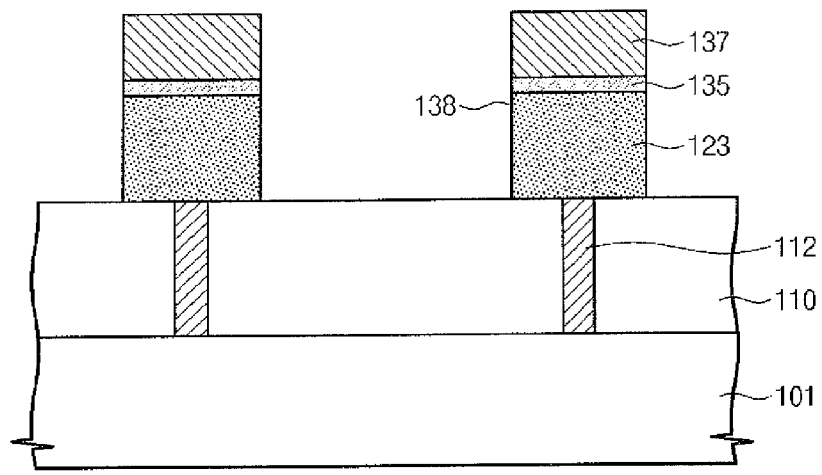
Figure 13B:
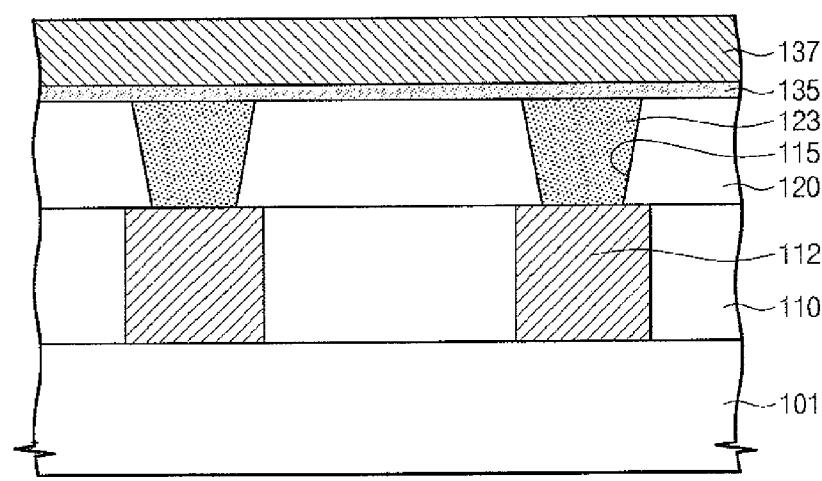

Referring to FIGS. 9, 13A and 13B, the conductive layer 136, the diffusion preventing layer 134 and the variable resistance lines 122 may be patterned using the mask pattern 139 as a mask. The patterning process may be, for example, a dry etching process. After the patterning process, the mask pattern 139 may be removed. A top electrode 137, a diffusion preventing pattern 135 and variable resistance patterns 123 may be formed by the patterning process. That is, the top electrode 137 and the variable resistance patterns 123 may be formed at the same time by the patterning process. Thus, the variable resistance patterns 123 have sidewalls aligned with a sidewall of the top electrode 137. The variable resistance patterns 123 may be provided as an isolated type structure in which the variable resistance patterns 123 are divided into each of the cells by the patterning process.

Referring back to FIGS. 9, 10A and 10B, a third interlayer insulating layer 140 may be formed in a recess region formed by the patterning process. The third interlayer insulating layer 140 may be formed by depositing an insulating material on the substrate 101, and then planarizing the insulating material down to a top surface of the top electrode 137.

A contact hole for a bit line exposing the top electrode 137 may be formed by forming a fourth interlayer insulating layer 145 on the top electrode 137, and then pattering the fourth interlayer insulating layer 145. A contact plug 141 may be formed by filling the contact hole for a bit line with a conductive material. A bit line (BL) contacting the contact plug 141 may be formed on the contact plug 141. The bit line (BL) may extend in the second direction along the top electrode 137.

Hereinafter, a variable resistance memory device in accordance with a third embodiment of the present inventive concept and a method of manufacturing the same will be described.

The third embodiment is similar to the first embodiment except for a difference in the type of the bottom electrode and the type of the variable resistance pattern. Thus, for convenience of description, the description of common features already discussed in the first embodiment will be omitted below.

Figure 14:
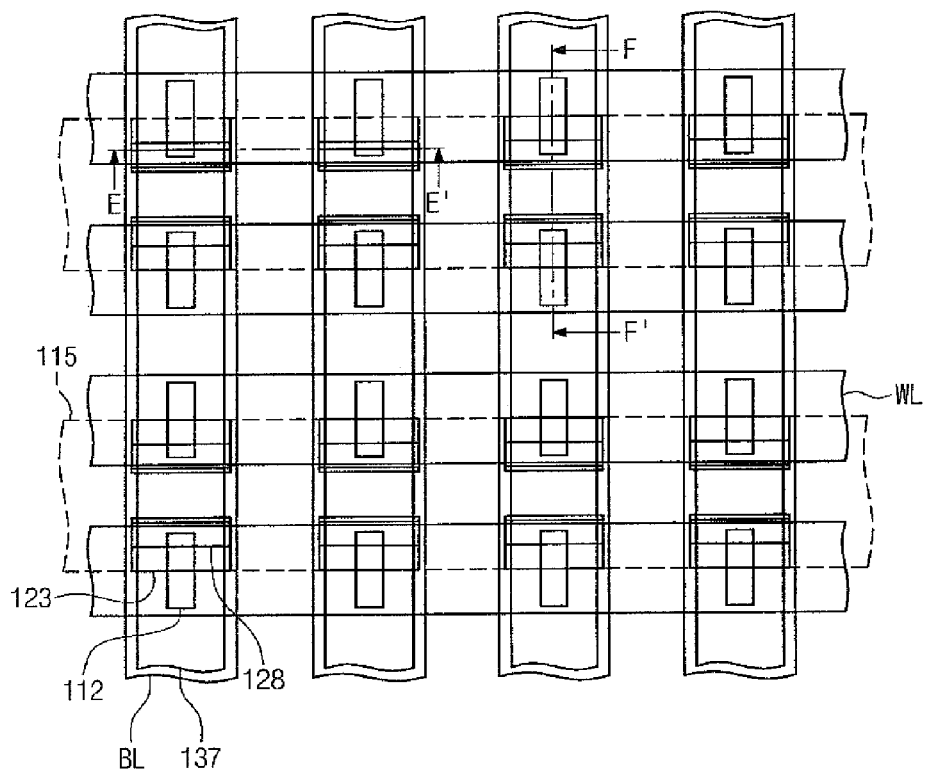
FIG. 14 is a top plan view of a variable resistance memory device in accordance with a third embodiment of the present inventive concept.
Figure 15A:
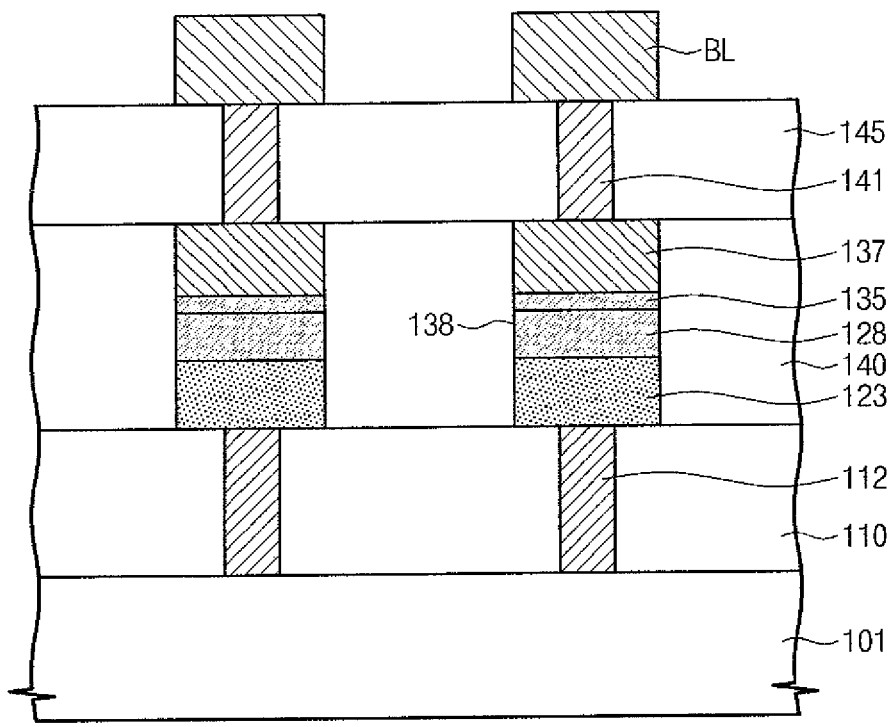
FIGS. 15A and 15B are cross-sectional views of a variable resistance memory device in accordance with the third embodiment of the present inventive concept, the cross-sectional views being taken along the lines E-E' and F-F' illustrated in FIG. 14, respectively.
Figure 15B:
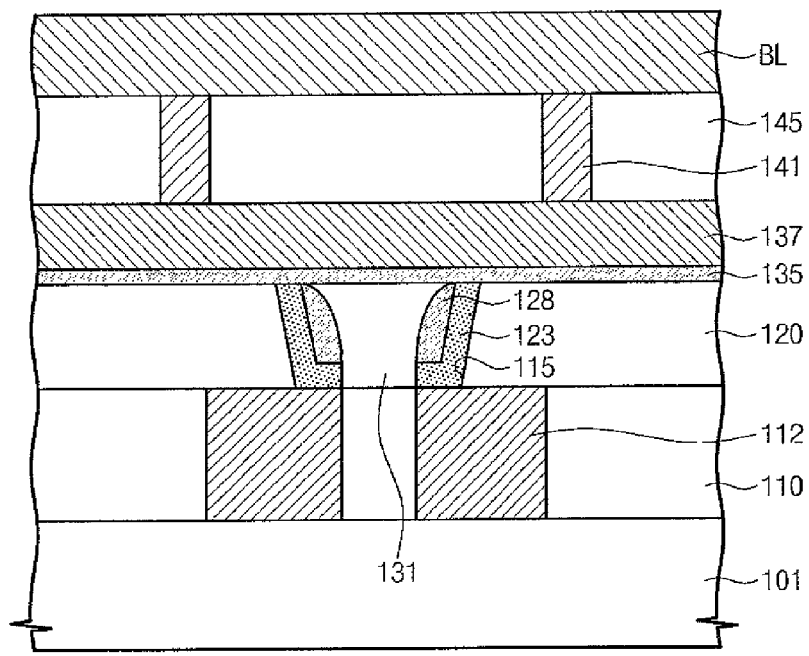

FIG. 14 is a top plan view of a variable resistance memory device in accordance with a third embodiment of the present inventive concept. FIGS. 15A and 15B are cross-sectional views of a variable resistance memory device in accordance with the third embodiment of the present inventive concept, the cross-sectional views being taken along the lines E-E' and F-F' illustrated in FIG. 14, respectively.

Referring to FIGS. 14, 15A and 15B, a first interlayer insulating layer 110 including bottom electrodes 112 may be provide on a substrate 101. The bottom electrodes 112 may have top surfaces of, for example, a line shape, an arc shape, a round shape, a square shape or a ring shape. In the present embodiment, the bottom electrodes 112 have top surfaces of a line shape arranged in a single line in a second direction crossing the first direction. That is, the top surfaces of the bottom electrodes 112 may have a major axis in the second direction and a minor axis in the first direction.

Variable resistance patterns 123, for example, phase change material patterns may be provided on the bottom electrodes 112. That is, the variable resistance patterns 123, as illustrated in FIG. 15B, may be separately provided in the second direction on the bottom electrodes 112. The variable resistance patterns 123 may have longitudinal sections of, for example, a U shape, an L shape or a square shape. In the present embodiment, the variable resistance patterns 123 have longitudinal sections of an L shape. That is, the variable resistance patterns 123 are comprised of a bottom portion and a side portion and thereby may have substantially longitudinal sections of an L shape. The variable resistance patterns 123 having an L shape may be symmetrical to variable resistance patterns of adjacent cells along the second direction. The variable resistance patterns having an L shape symmetrical to each other may be formed on both sidewalls of a trench 115 extending in the first direction. The trench 115 may be formed in a second interlayer insulating layer 120. Thus, the variable resistance patterns 123 may be separately provided in the second direction on the bottom electrode 112. The variable resistance patterns 123 may be divided in the first direction. That is, the variable resistance patterns 123 may be provided to be an isolated type structure on the bottom electrodes 112. The isolated type structure of the variable resistance patterns 123 may alleviate an interference phenomenon between cells.

A heat loss preventing pattern 128 may be provided on the variable resistance patterns 123. The heat loss preventing pattern 128 may prevent heat generated when heating a phase change material from being lost. The heat loss preventing pattern 128 may be provided to have a space shape on the variable resistance pattern 123. An insulating pattern 131 filling the trench 115 may be provided on the heat loss preventing pattern 128. The insulating pattern 131 may be, for example, an oxide layer.

A top electrode 137 extending in the second direction may be provided on the variable resistance patterns 123. The top electrode 137 may be perpendicular to the trench 115. A diffusion preventing pattern 135 may be provided between the variable resistance pattern 123 and the top electrode 137. The diffusion preventing layer 135 may have a length extending in the second direction.

The variable resistance patterns 123, the heat loss preventing pattern 128, the diffusion preventing pattern 135 and top electrode 137 may have aligned sidewalls 138 as illustrated in FIG. 15A. That is, the variable resistance patterns 123, the heat loss preventing pattern 128 and the diffusion preventing pattern 135 may include sidewalls aligned with a sidewall of the top electrode 137. A third interlayer insulating layer 140 may be provided between the aligned sidewalls 138.

A bit line (BL) crossing the word line (WL) may be provided on the top electrode 137. The bit line (BL) can be electrically connected to the top electrode 137 through a contact plug 141 formed in a fourth interlayer insulating layer 145.

In the present embodiment, a sidewall of the variable resistance pattern 123 aligned with the top electrode 137 is a long distance away from the bottom electrode 112. Therefore, deterioration of an electric characteristic due to damage occurring when the variable resistance patterns 123 are formed by patterning may be improved.

Hereinafter, a method of manufacturing a variable resistance memory device in accordance with a third embodiment of the present inventive concept will be described.

FIGS. 16A through 19A are cross-sectional views taken along the line E-E' of FIG. 14 illustrating a method of manufacturing a variable resistance memory device in accordance with the third embodiment of the present inventive concept. FIGS. 16B through 19B are cross-sectional views taken along the line F-F' of FIG. 14 illustrating a method of manufacturing a variable resistance memory device in accordance with the third embodiment of the present inventive concept.

Figure 16A:
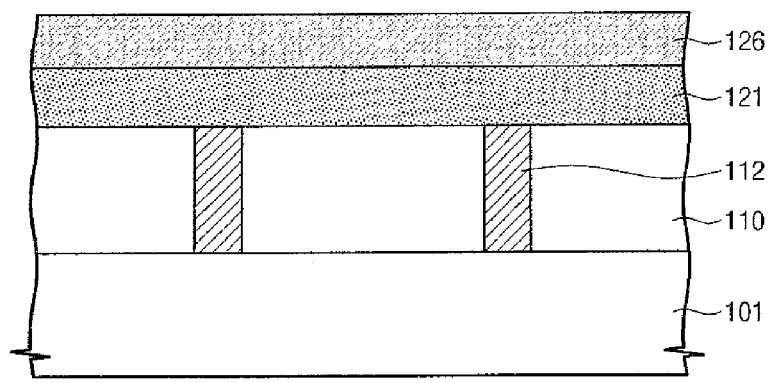
Figure 16B:
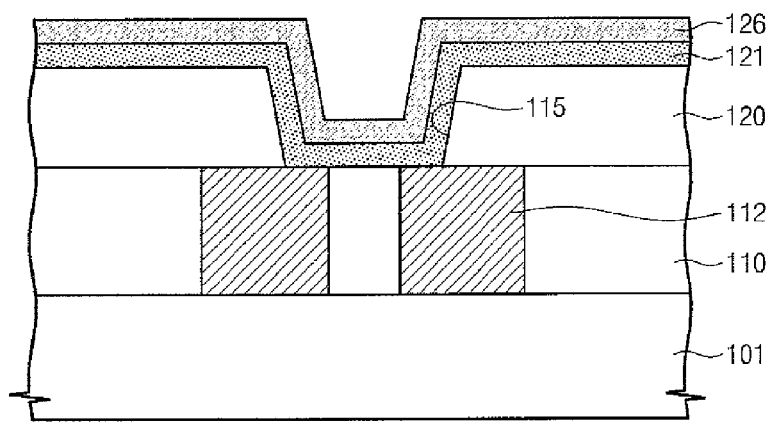

Referring to FIGS. 14, 16A and 16B, a first interlayer insulating layer 110 including bottom electrodes 112 is formed on a substrate 101. A second interlayer insulating layer 120 is provided on the bottom electrodes 112. The second interlayer insulating layer 120 is patterned to form a trench 115 extending in a first direction. The trench 115 may be provided on two bottom electrodes 112 adjacent to each other along a second direction. The trench 115 exposes a portion of top surfaces of the two adjacent bottom electrodes 112.

A variable resistance material 121 and a heat loss preventing layer 126 may be formed on a sidewall and a bottom surface of the trench 115 and on the second interlayer insulating layer 120.

Figure 17A:
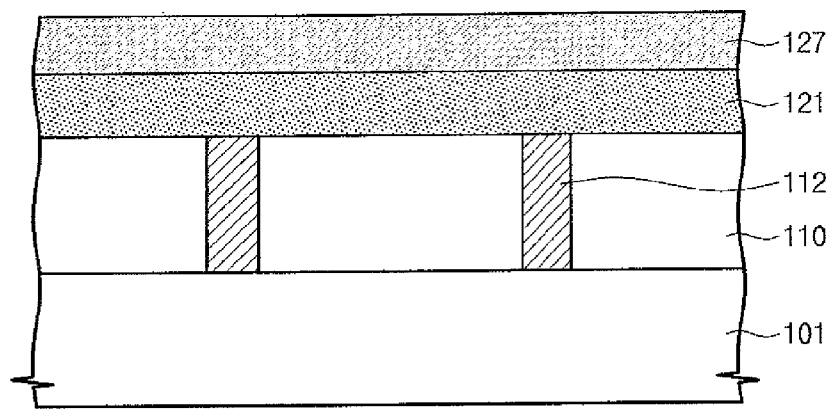
Figure 17B:
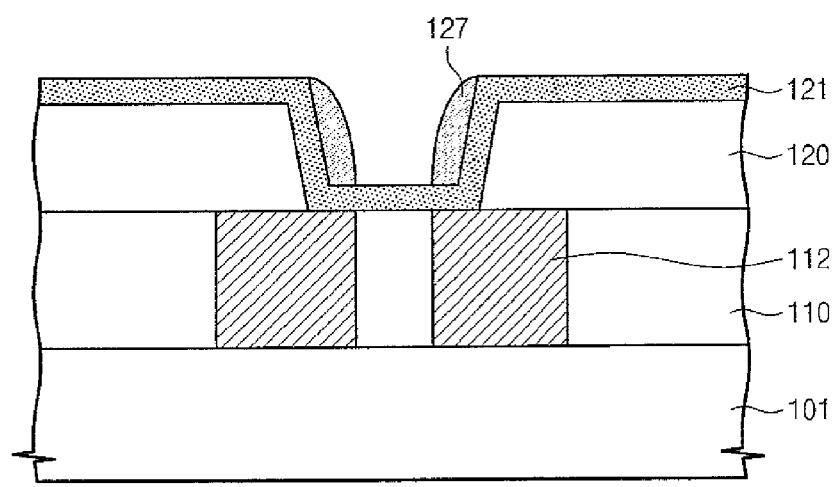

Referring to FIGS. 14, 17A and 17B, a spacer forming process is performed on the heat loss preventing layer 126 to form a heat loss preventing preliminary pattern 127 on both sidewalls of the trench 115. The heat loss preventing preliminary pattern 127 may expose a portion of the variable resistance material layer 121 in the trench 115.

Figure 18A:
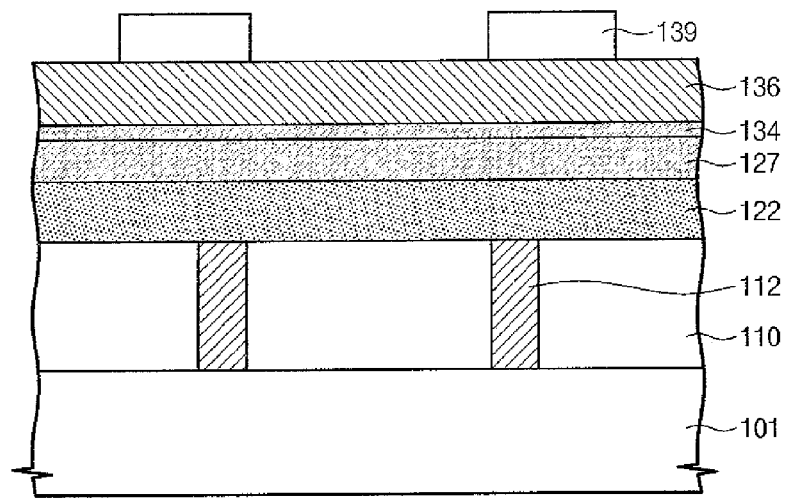
Figure 18B:
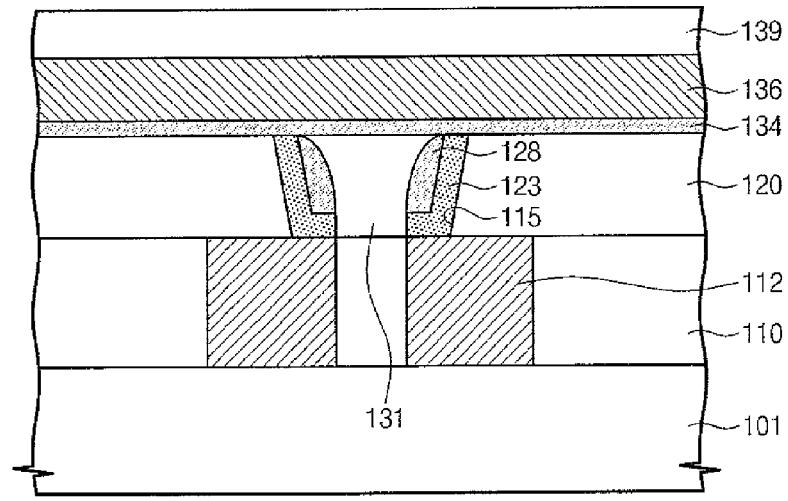

Referring to FIGS. 14, 18A and 18B, variable resistance lines 122 having an L shape separated from one another are formed by removing an exposed portion of the variable resistance material layer 121 using the heat loss preventing preliminary pattern 127 as a mask, and then performing a planarization process. The variable resistance lines 122 may be separately formed on inner sidewalls of the trench 115. Before the planarization process, an insulating pattern 131 may be formed so as to completely fill the trench 115. After the planarization process, a plasma process using, for example, an inert gas may be performed.

A conductive layer 136 may be formed on the variable resistance lines 122, the heat loss preventing preliminary pattern 127 and the insulating pattern 131. The conductive layer 136 may be the same material as the bottom electrode 112. A diffusion preventing layer 134 may be provided between the conductive layer 136 and the variable resistance lines 122. The conductive layer 136 and the diffusion preventing layer 134 may be formed by, for example, a PVD process or a CVD process. A mask pattern 139 may be provided on the conductive layer 136. The mask pattern 139 may extend in the second direction.

Figure 19A:
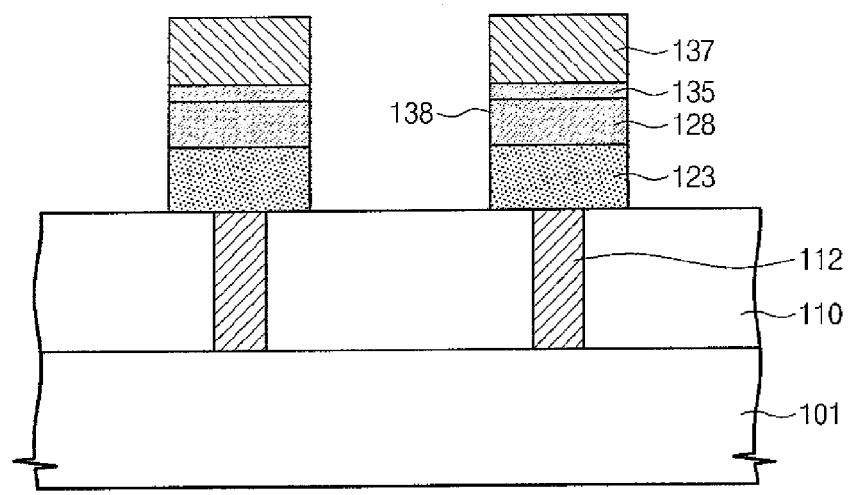
Figure 19B:
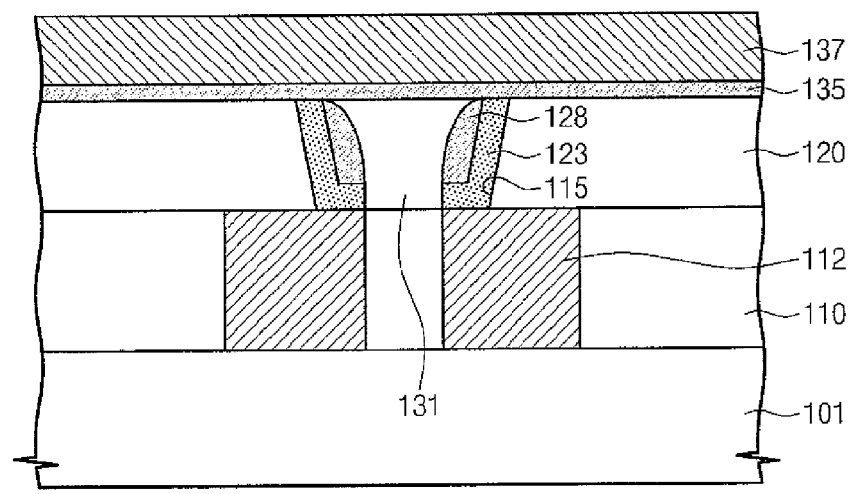

Referring to FIGS. 14, 19A and 19B, the conductive layer 136, the diffusion preventing layer 134, the heat loss preventing preliminary pattern 127 and the variable resistance lines 122 may be patterned using the mask pattern 139 as a mask. The patterning process may be, for example, a dry etching process. After the patterning process, the mask pattern 139 may be removed. A top electrode 137, a diffusion preventing pattern 135, a heat loss preventing pattern 128 and a variable resistance pattern 123 may be formed by the patterning process. That is, the top electrode 137 and the variable resistance pattern 123 may be simultaneously formed by the patterning process. Thus, the variable resistance pattern 123 may have a sidewall aligned with a sidewall of the top electrode 137. The variable resistance patterns 123 may be provided as an isolated type structure in which the variable resistance patterns 123 are divided into each cell by the patterning process.

Referring back to FIGS. 14, 15A and 15B, a third interlayer insulating layer 140 may be formed in a recess region formed by the patterning process. A fourth interlayer insulating layer 145 is formed on the top electrode 137 and the fourth interlayer insulating layer 145 is patterned to form a contact hole for a bit line exposing the top electrode 137. A contact plug 141 may be formed by filling the contact hole for a bit line with a conductive material. A bit line (BL) contacting the contact plug 141 may be formed on the contact plug 141. The bit line (BL) may have a length parallel to the top electrode 137 and extending in the second direction.

Hereinafter, a method of manufacturing a variable resistance memory device in accordance with a fourth embodiment of the present inventive concept will be described.

The fourth embodiment is similar to the first embodiment except for a difference in the type of the bottom electrode and the type of the variable resistance pattern. Thus, for convenience of description, the description of common features already discussed in the first embodiment will be omitted below.

Figure 20:
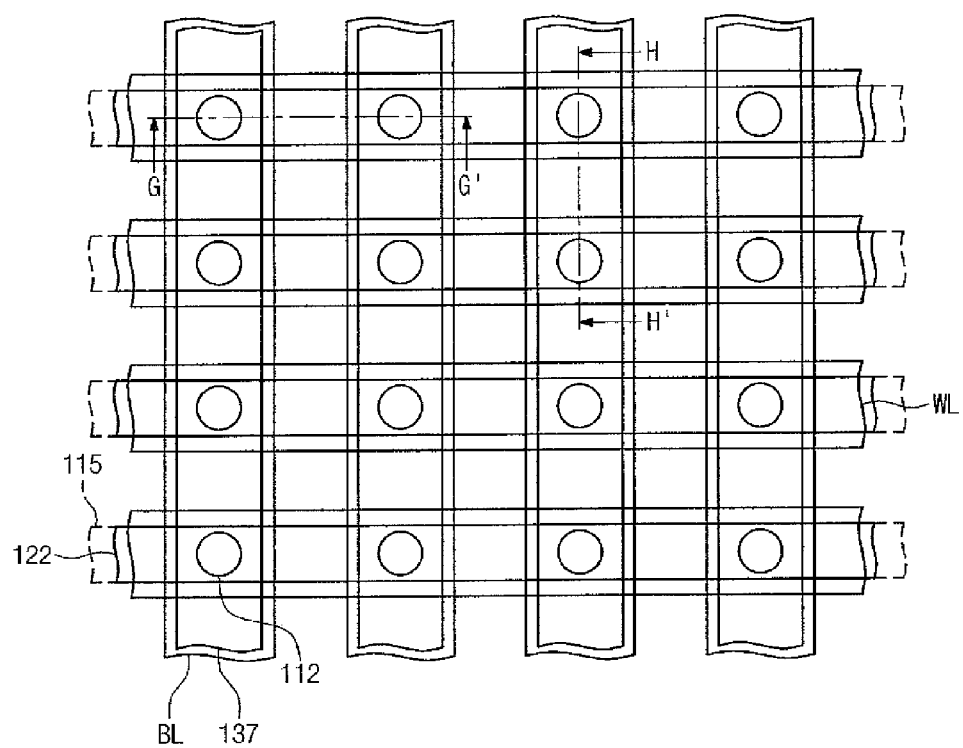
FIG. 20 is a top plan view of a variable resistance memory device in accordance with a fourth embodiment of the present inventive concept.
Figure 21A:
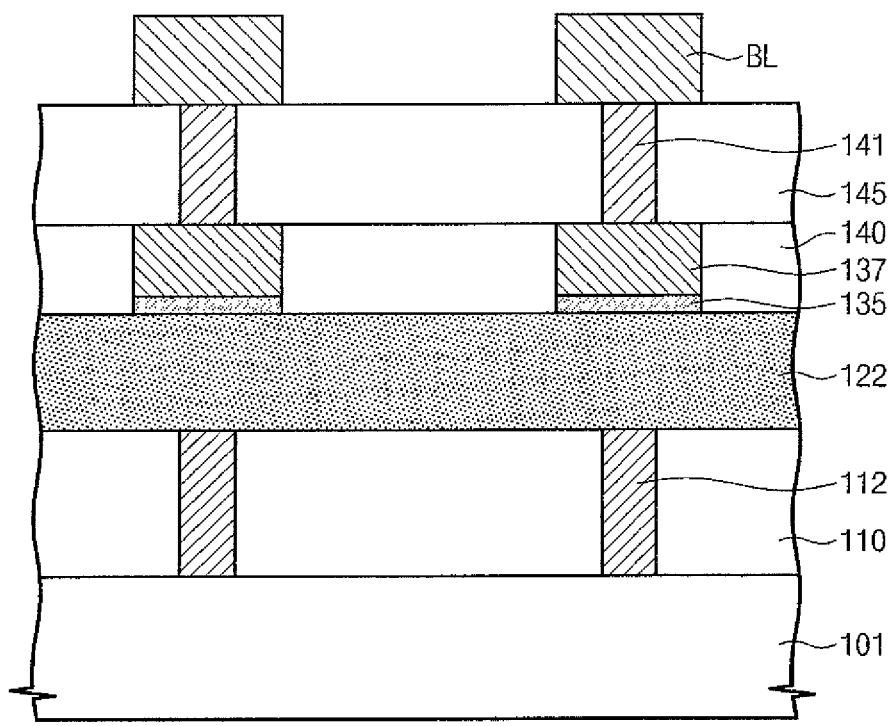
FIGS. 21A and 21B are cross-sectional views of a variable resistance memory device in accordance with the fourth embodiment of the present inventive concept, the cross-sectional views being taken along the lines G-G' and H-H' illustrated in FIG. 20, respectively.
Figure 21B:
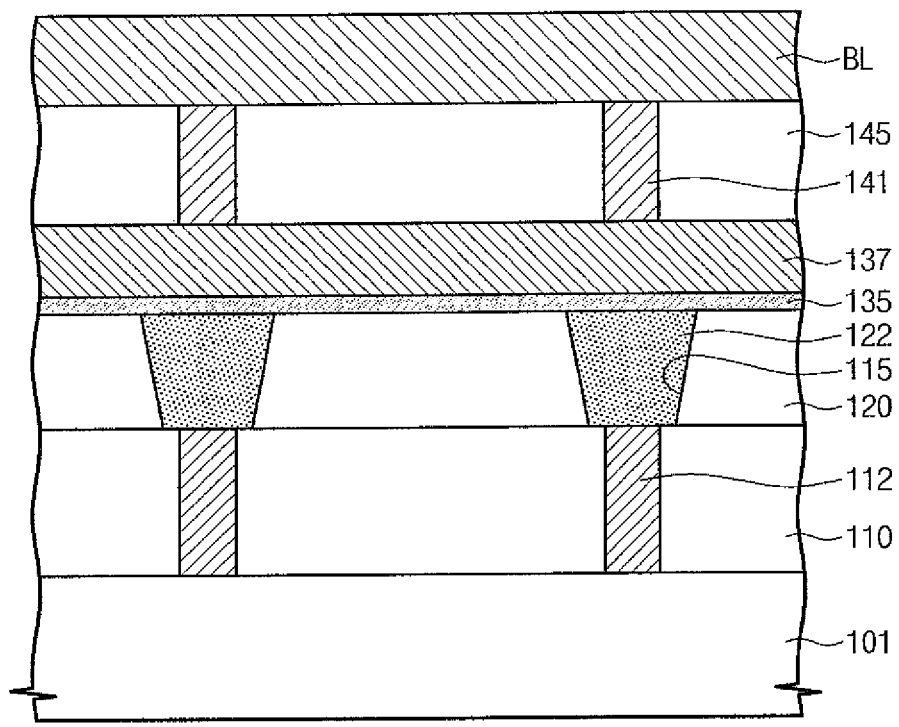
Figure 22A:
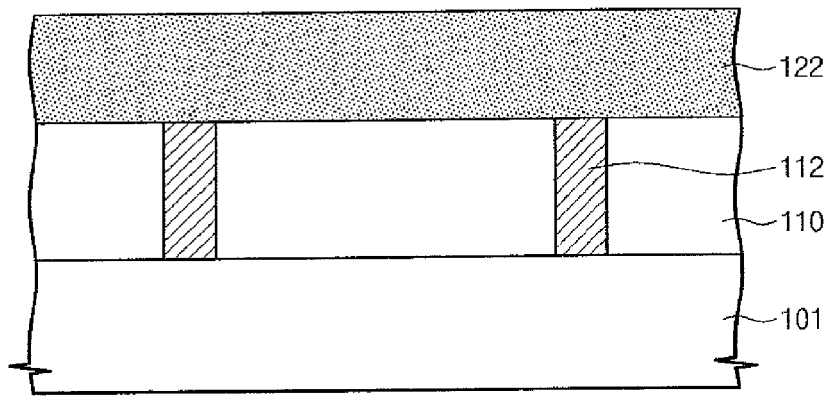
Figure 22B:
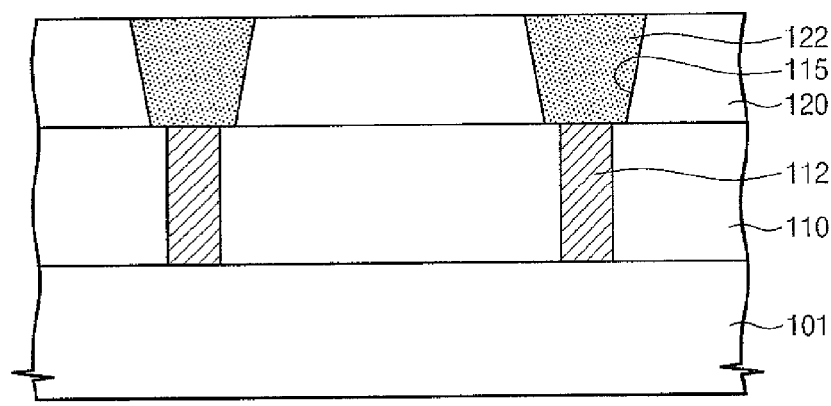

FIG. 20 is a top plan view of a variable resistance memory device in accordance with a fourth embodiment of the present inventive concept. FIGS. 21A and 21B are cross-sectional views of a variable resistance memory device in accordance with the fourth embodiment of the present inventive concept. FIGS. 21A and 21B are cross-sectional views taken along the lines G-G' and H-H' illustrated in FIG. 20, respectively.

Referring to FIGS. 20, 21A and 21B, a first interlayer insulating layer 110 including bottom electrodes 112 may be provided on a substrate 101. The bottom electrodes 112 may have top surfaces of, for example, a line shape, an arc shape, a round shape, a square shape or a ring shape. In the present embodiment, the bottom electrodes 112 have top surfaces of a round shape.

Variable resistance lines 122, for example, a phase change material line, may be provided on the bottom electrodes 112. In the drawings, the variable resistance lines 122 are illustrated to have a longitudinal section of a square shape but are not limited thereto. That is, the variable resistance lines 122 may have, for example, a longitudinal section of a U shape or an L shape. The variable resistance lines 122 may be provided in a trench 115 extending in a first direction. The trench 115 may be formed on a second interlayer insulating layer 120. Thus, the variable resistance lines 122 may be separately provided in a second direction on the bottom electrodes 112.

A top electrode 137 extending in the second direction may be provided on the variable resistance lines 122. The top electrodes 137 may cross the trench 115. A diffusion preventing pattern 135 may be provided between the variable resistance lines 122 and the top electrode 137. The diffusion preventing pattern 135 may extend in the second direction.

A bit line (BL) crossing the word line (WL) may be formed on the top electrode 137. The bit line (BL) may be electrically connected to the top electrode 137 through a contact plug 141 formed in a fourth interlayer insulating layer 145.

Hereinafter, a method of manufacturing a variable resistance memory device in accordance with a fourth embodiment of the present inventive concept is provided.

FIGS. 22A through 24A are cross-sectional views taken along the line G-G' of FIG. 20 illustrating a method of manufacturing a variable resistance memory device in accordance with the fourth embodiment of the present inventive concept. FIGS. 22B through 24B are cross-sectional views taken along the line of FIG. 20 illustrating a method of manufacturing a variable resistance memory device in accordance with the fourth embodiment of the present inventive concept Referring to FIGS. 20, 22A and 22B, a first interlayer insulating layer 110 is formed on a substrate 101. Bottom electrodes 112 are formed in the first interlayer insulating layer 110. In the present embodiment, the bottom electrodes 112 are formed to have top surfaces of a round shape. A second interlayer insulating layer 120 may be provided on the bottom electrodes 112. The second interlayer insulating layer 120 is patterned to form a trench 115 extending in a first direction. The trench 115 exposes a portion of top surface of the bottom electrode 112. The trench 115 may be formed by, for example, anisotropically etching the second interlayer insulating layer 120 so that a width of the trench 115 is reduced from an upper portion to a lower portion.

Variable resistance lines 122 may be formed inside the trench 115. The variable resistance lines 122 may extend in the first direction. The variable resistance lines 122 are separately disposed in a second direction. The variable resistance lines 122 may be formed by depositing a variable resistance material layer on the second interlayer insulating layer 120, and then planarizing the variable resistance material layer.

Figure 23A:
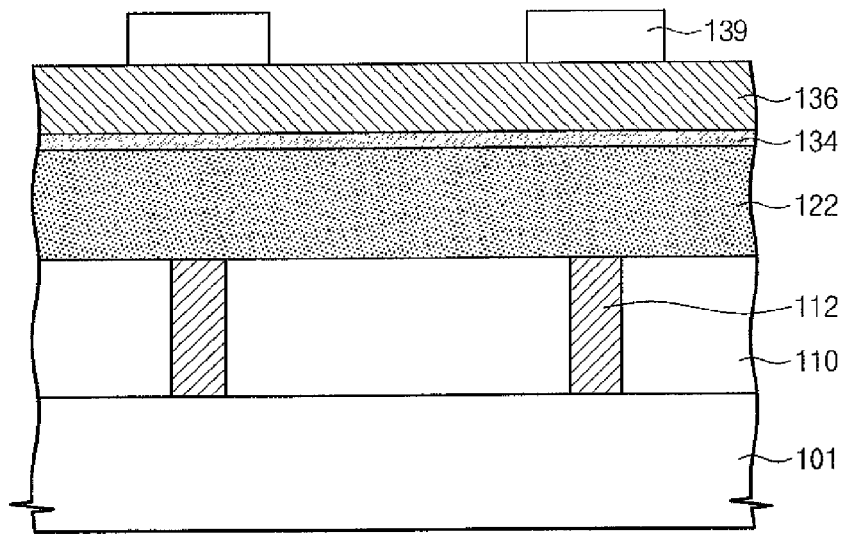
Figure 23B:
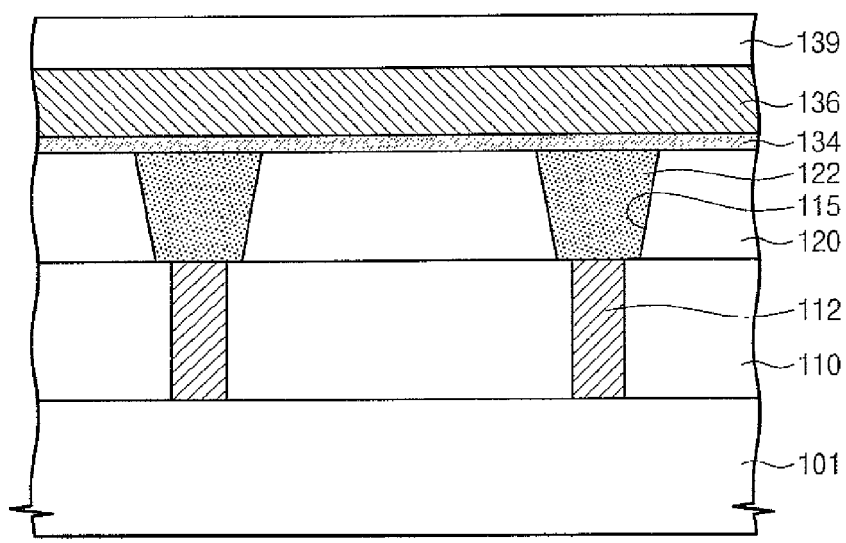
Figure 24A:
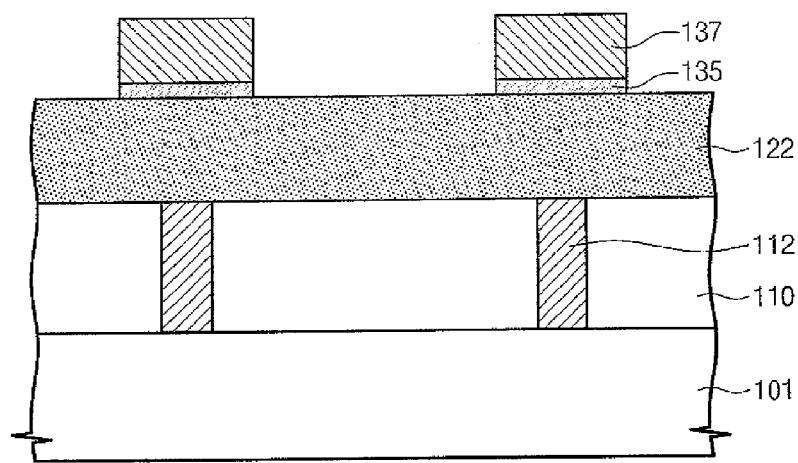
Figure 24B:
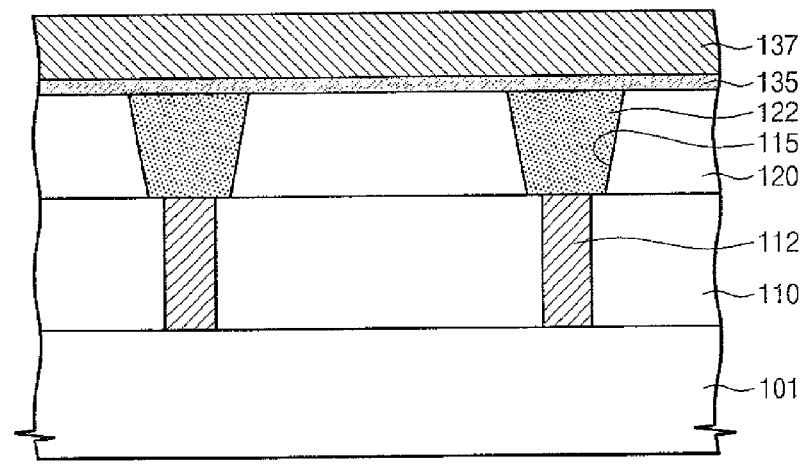

Referring to FIGS. 20, 23A and 23B, a conductive layer 136 may be formed on the variable resistance lines 122. The conductive layer 136 may be the same material as the bottom electrodes 112. A diffusion preventing layer 134 may be provided between the conductive layer 136 and the diffusion preventing layer 134. The conductive layer 136 and the diffusion preventing layer 134 may be formed by, for example, a PVD process or a CVD process. A mask pattern 139 may be provided on the conductive layer 136. The mask pattern 139 may extend in a second direction. Referring to FIGS. 20, 24A and 24B, the conductive layer 136 and the diffusion preventing layer 134 may be patterned using the mask pattern 139 as a mask. In the present embodiment, the variable resistance lines 122 are not patterned together with the conductive layer 136 and the diffusion preventing layer 134. The patterning process may be, for example, a dry etching process. After the patterning process, the mask pattern 139 may be removed. A top electrode 137 and a diffusion preventing pattern 135 may be formed by the patterning process.

Referring back to FIGS. 20, 21A and 21B, a third interlayer insulating layer 140 may be formed in a recess region formed by the patterning process. The third interlayer insulating layer 140 may be formed by depositing an insulating material on the substrate 101, and then planarizing the insulating material down to a top surface of the top electrode 137. A fourth interlayer insulating layer 145 is formed on the top electrode 137 and a contact hole for a bit line exposing the top electrode 137 may be formed by patterning the fourth interlayer insulating layer 145. A contact plug 141 may be formed by filling the contact hole for a bit line with a conductive material. A bit line (BL) contacting the contact plug 141 may be formed on the contact plug 141. The bit line (BL) may have a length parallel to the top electrode 137 and extending in the second direction.

Figure 25:
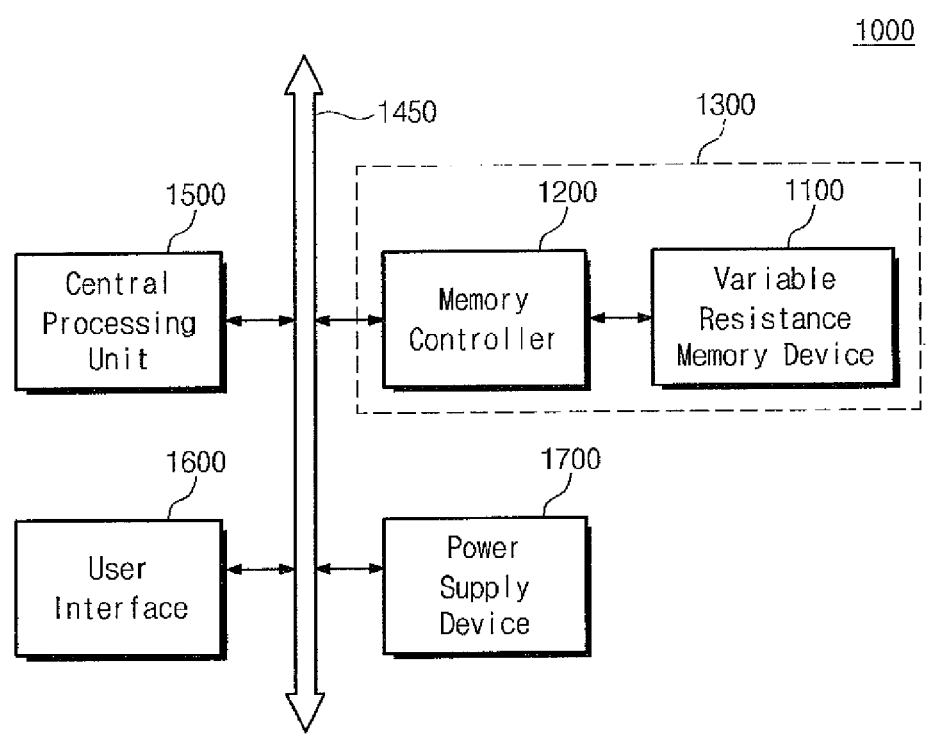
FIG. 25 is a memory system block diagram illustrating an application example of a variable resistance memory device in accordance with embodiments of the present inventive concept.

FIG. 25 is a memory system block diagram illustrating an application example of a variable resistance memory device in accordance with embodiments of the present inventive concept.

Referring to FIG. 25, a memory system 1000 in accordance with the present inventive concept includes a semiconductor memory device 1300 comprised of a variable resistance memory device (for example, PRAM: 1100) and a memory controller 1200, and a central processing unit 1500, a user interface 1600 and a power supply device 1700 that are electrically connected to a system bus 1450.

Data provided through the user interface 1600 or processed by the central processing unit 1500 is stored in the variable resistance memory device 1100 through the user interface 1600. The variable resistance memory device 1100 may be constituted by a solid state drive (SSD). In this case, a writing speed of the memory system 1000 may become greatly fast.

Although not illustrated in the drawings, for example, an application chipset, a camera image processor (CIS), a mobile DRAM or the like may be further provided to the memory system in accordance with the present inventive concept.

Also, the memory system 1000 may be applied to, for example, PDA, a portable computer, a web tablet, a wireless phone, a mobile phone, a digital music player, a memory card or all the devices that can transmit and/or receive data in a wireless environment.

Further, the variable resistance memory device or the memory system may be mounted by various types of packages such as, for example, PoP (package on package), ball grid array (BGA), chip scale package (CSP), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline (SOIC), shrink small outline package (SSOP), thin small outline (TSOP), thin quad flatpack (TQFP), system in package (SIP), multi chip package (MCP), wafer-level fabricated package (WFP) and wafer-level processed stack package (WSP).

According to the embodiments of the present inventive concept, a misalignment difficulty between the variable resistance patterns and the top electrode can be prevented. Therefore, the electric characteristic and the reliability of the resistance variable memory device may be improved.

The above-disclosed subject matter is to be considered illustrative, and not restrictive, and the appended claims are intended to cover all such modifications, enhancements, and other embodiments, which fall within the true spirit and scope of the inventive concept. Thus, to the maximum extent allowed by law, the scope of the inventive concept is to be determined by the broadest permissible interpretation of the following claims and their equivalents, and shall not be restricted or limited by the foregoing detailed description.

What is claimed is:

1. A method of manufacturing a variable resistance memory device, comprising:
   forming a plurality of bottom electrodes on a substrate;
   forming a plurality of variable resistance lines extending in a first direction on the bottom electrodes, wherein the forming of the variable resistance lines comprises:
      forming a first interlayer insulating layer on the bottom electrodes,
      forming a trench in the first interlayer insulating layer, the trench extending in the first direction and exposing a portion of a top surface of the bottom electrodes, and
      forming a variable resistance material layer in the trench; and
   forming a top electrode extending in a second direction crossing the first direction on the variable resistance lines, wherein the forming of the top electrode comprises:
      forming a conductive layer on the variable resistance lines;
      forming a mask pattern extending in the second direction on the conductive layer; and
      patterning the conductive layer using the mask pattern so that the conductive layer extends in the second direction.

2. The method of claim 1, wherein the bottom electrodes are formed to have a top surface of which a length in the second direction is longer than a length in the first direction.

3. The method of claim 1, further comprising:
   forming a second interlayer insulating layer on the top electrode;

patterning the second interlayer insulating layer to form a contact hole for a bit line therein exposing the top electrode;

forming a contact plug in the contact hole by filling the contact hole for the bit line with a conductive material; and forming the bit line contacting the contact plug, the bit line extending in the second direction along the top electrode.

4. The method of claim 1, wherein the patterning of the conductive layer using the mask pattern comprises forming variable resistance patterns divided in the first direction by patterning the variable resistance lines together with the conductive layer such that the top electrode and the variable resistance pattern are simultaneously formed by the patterning process.

5. The method of claim 4, wherein the variable resistance patterns have sidewalls aligned with a sidewall of the top electrode.

6. A method of manufacturing a variable resistance memory device, comprising:
forming a plurality of bottom electrodes on a substrate;
forming a plurality of variable resistance lines extending in a first direction on the bottom electrodes, wherein the forming of the variable resistance lines comprises:
forming a first interlayer insulating layer on the bottom electrodes,
forming a trench in the first interlayer insulating layer, the trench extending in the first direction and exposing a portion of a top surface of the bottom electrodes, and
forming a variable resistance material layer in the trench;
forming a top electrode extending in a second direction crossing the first direction on the variable resistance lines; and
forming a heat loss preventing layer on the variable resistance material layer.

7. The method of claim 6, further comprising forming an insulating layer on the heat loss preventing layer; and
planarizing the insulating layer until a top surface of the interlayer insulating layer is exposed.

8. A method of manufacturing a variable resistance memory device, comprising:
forming a plurality of bottom electrodes on a substrate;
forming a plurality of variable resistance lines extending in a first direction on the bottom electrodes, wherein the forming of the variable resistance lines comprises:
forming a first interlayer insulating layer on the bottom electrodes,
forming a trench in the first interlayer insulating layer, the trench extending in the first direction and exposing a portion of a top surface of the bottom electrodes, and
forming a variable resistance material layer in the trench;
forming a top electrode extending in a second direction crossing the first direction on the variable resistance lines, wherein the trench is formed to expose two bottom electrodes adjacent to each other along the second direction;
forming a spacer on an inner sidewall of the variable resistance material layer; and
removing an exposed portion of the variable resistance material layer using the spacer as an etching mask.

9. The method of claim 8, wherein the spacer is a heat loss preventing pattern.

10. A method of manufacturing a variable resistance memory device, comprising:
forming a plurality of bottom electrodes on a substrate;
forming a plurality of variable resistance lines extending in a first direction on the bottom electrodes, wherein the forming of the variable resistance lines comprises:
forming a first interlayer insulating layer on the bottom electrodes,
forming a trench in the first interlayer insulating layer, the trench extending in the first direction and exposing a portion of a top surface of the bottom electrodes, and
forming a variable resistance material layer in the trench; and
forming a top electrode extending in a second direction crossing the first direction on the variable resistance lines, wherein the plurality of variable resistance lines are spaced apart from each other in the second direction, wherein the forming of the top electrode comprises:
forming a conductive layer on the variable resistance lines,
forming a mask pattern extending in the second direction on the conductive layer, and
patterning the conductive layer using the mask pattern so that the conductive layer extends in the second direction.

11. The method of claim 10, wherein the bottom electrodes are formed to have a top surface of which a length in the second direction is longer than a length in the first direction.

12. The method of claim 10, further comprising:
forming a second interlayer insulating layer on the top electrode;
patterning the second interlayer insulating layer to form a contact hole for a bit line therein exposing the top electrode;
forming a contact plug in the contact hole by filling the contact hole for the bit line with a conductive material; and
forming the bit line contacting the contact plug, the bit line extending in the second direction along the top electrode.

13. The method of claim 10, wherein the patterning of the conductive layer using the mask pattern comprises forming variable resistance patterns divided in the first direction by patterning the variable resistance lines together with the conductive layer such that the top electrode and the variable resistance pattern are simultaneously formed by the patterning process.

14. The method of claim 10, further comprising forming a heat loss preventing layer on the variable resistance material layer.

15. The method of claim 14, further comprising forming an insulating layer on the heat loss preventing layer; and
planarizing the insulating layer until a top surface of the interlayer insulating layer is exposed.

16. The method of claim 10, wherein the trench is formed to expose two bottom electrodes adjacent to each other along the second direction.

17. The method of claim 16, further comprising:
forming a spacer on an inner sidewall of the variable resistance material layer; and
removing an exposed portion of the variable resistance material layer using the spacer as an etching mask.

18. The method of claim 13, wherein the variable resistance patterns have sidewalls aligned with a sidewall of the top electrode.

* * * * *